US012626030B2

(12) United States Patent
Troy et al.

(10) Patent No.: US 12,626,030 B2
(45) Date of Patent: May 12, 2026

(54) TEMPORAL BASED MULTICONFIGURATION DATASET SYSTEM

(71) Applicant: The Boeing Company, Chicago, IL (US)

(72) Inventors: James J. Troy, Issaquah, WA (US); James Edward Fadenrecht, Everett, WA (US); Vladimir Karakusevic, Bellevue, WA (US); Christopher Esposito, Issaquah, WA (US); Rohan Jayantilal Rana, Seattle, WA (US); Robert Allan Brandt, Lake Stevens, WA (US)

(73) Assignee: The Boeing Company, Arlington, VA (US)

( * ) Notice: Subject to any disclaimer, the term of this patent is extended or adjusted under 35 U.S.C. 154(b) by 1056 days.

(21) Appl. No.: 17/660,364

(22) Filed: Apr. 22, 2022

(65) Prior Publication Data

US 2023/0342513 A1    Oct. 26, 2023

(51) Int. Cl.
*G06F 30/15* (2020.01)
*B64F 5/00* (2017.01)

(52) U.S. Cl.
CPC .............. *G06F 30/15* (2020.01); *B64F 5/00* (2013.01)

(58) Field of Classification Search
CPC .................................. G06F 30/15; B64F 5/00
See application file for complete search history.

(56) References Cited

U.S. PATENT DOCUMENTS

| | | | |
|---|---|---|---|
| 9,110,560 B1 | 8/2015 | Senesac | |
| 10,831,946 B2 * | 11/2020 | Troy | G06F 16/22 |
| 12,346,636 B2 * | 7/2025 | Huovila | G06F 30/20 |
| 2005/0022152 A1 * | 1/2005 | Turk | G06F 30/15 |
| | | | 717/100 |
| 2015/0199470 A1 * | 7/2015 | Young | G06F 30/15 |
| | | | 700/98 |
| 2018/0089237 A1 * | 3/2018 | Dunne | G06T 11/206 |
| 2018/0300326 A1 | 10/2018 | Troy et al. | |
| 2018/0300446 A1 * | 10/2018 | Troy | G06F 30/15 |

* cited by examiner

*Primary Examiner* — Kibrom K Gebresilassie
(74) *Attorney, Agent, or Firm* — Yee & Associates, P.C.

(57) ABSTRACT

A temporal multi-configuration model dataset system comprises a computer system configured to: compare a prior parts list for a vehicle at a point in time to a current parts list in which comparing the prior parts list with the current parts list results in a comparison; determine change lists for the parts that changed using the comparison; append models to a model dataset for the vehicle in response to parts added to the vehicle, wherein models are not removed from the model dataset in response to parts being removed from the vehicle; determine display parts in the model dataset present for a selected point in time in response to receiving a request to visualize the vehicle at the selected point in time in which the display parts are determined using the set of change lists; and display a visualization of the vehicle using the display parts on a display system.

20 Claims, 19 Drawing Sheets

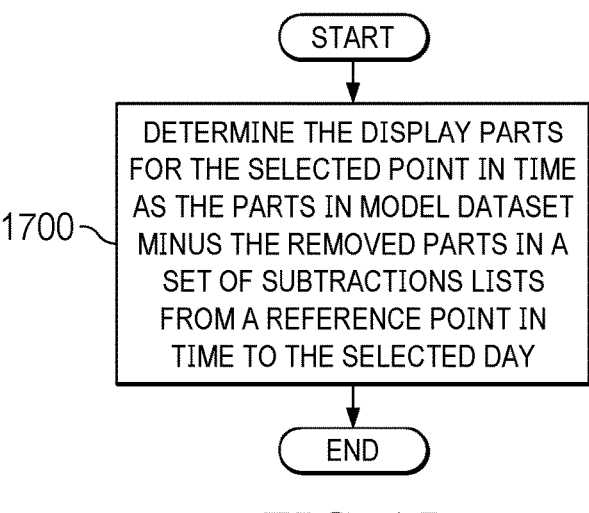

1700 —

START

DETERMINE THE DISPLAY PARTS
FOR THE SELECTED POINT IN TIME
AS THE PARTS IN MODEL DATASET
MINUS THE REMOVED PARTS IN A
SET OF SUBTRACTIONS LISTS
FROM A REFERENCE POINT IN
TIME TO THE SELECTED DAY

END

FIG. 17

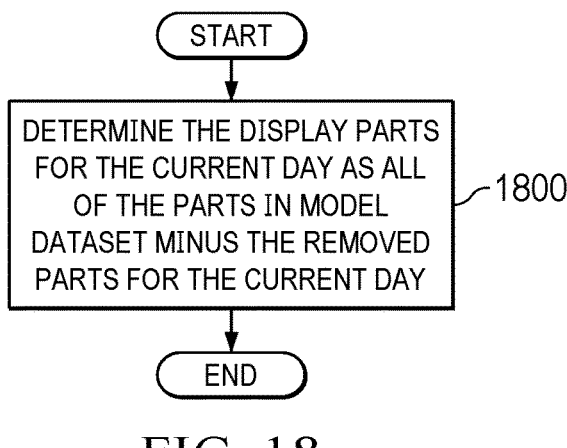

START

DETERMINE THE DISPLAY PARTS
FOR THE CURRENT DAY AS ALL
OF THE PARTS IN MODEL
DATASET MINUS THE REMOVED
PARTS FOR THE CURRENT DAY

1800

END

START

DETERMINE THE DISPLAY PARTS
FOR THE SELECTED POINT IN
TIME AS THE PARTS IN THE MODEL
DATASET MINUS THE REMOVED
PARTS FROM A CURRENT DAY TO
A DAY AFTER THE SELECTED DAY

END

FIG. 19

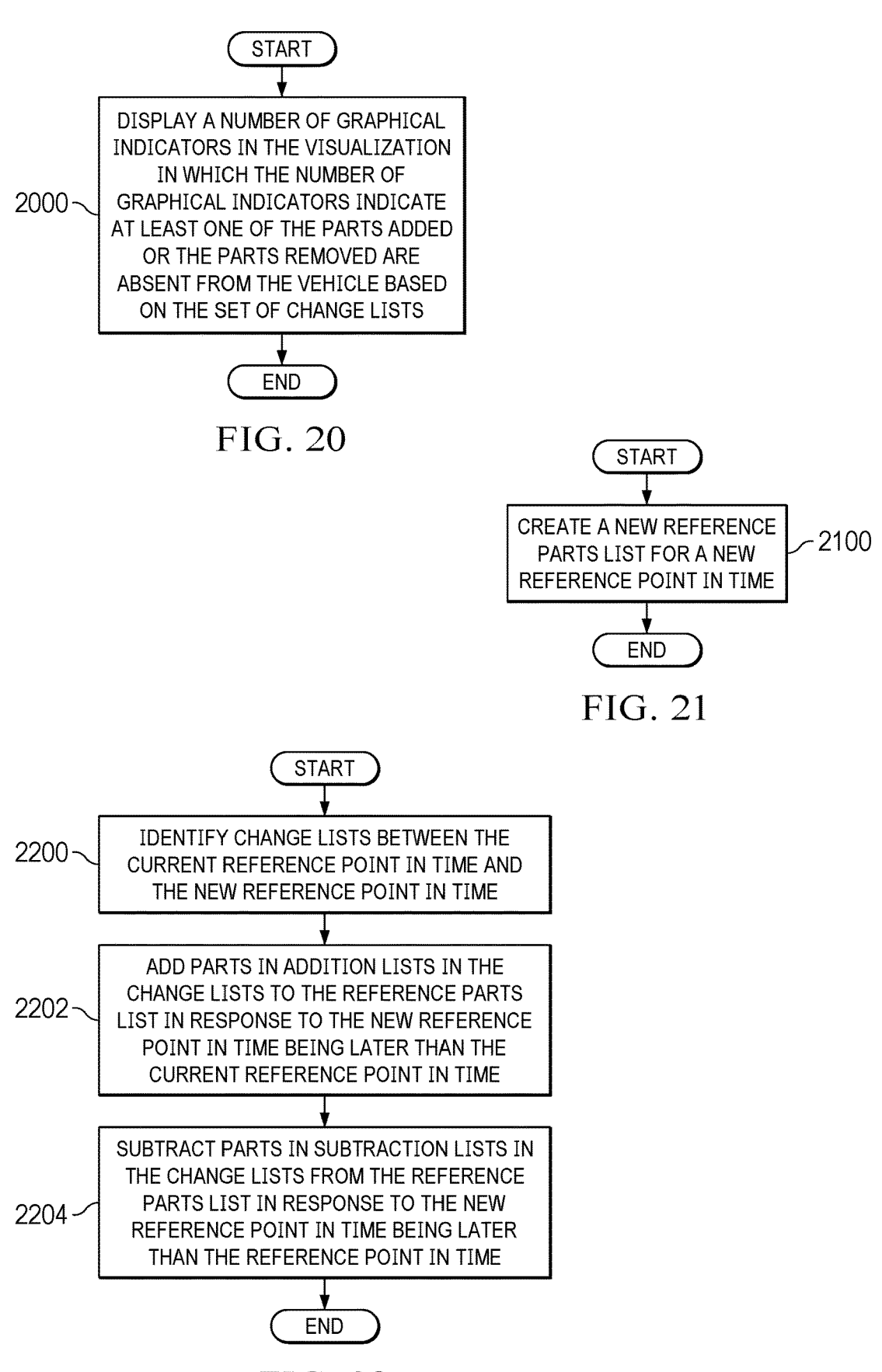

START

2000 — DISPLAY A NUMBER OF GRAPHICAL INDICATORS IN THE VISUALIZATION IN WHICH THE NUMBER OF GRAPHICAL INDICATORS INDICATE AT LEAST ONE OF THE PARTS ADDED OR THE PARTS REMOVED ARE ABSENT FROM THE VEHICLE BASED ON THE SET OF CHANGE LISTS

END

FIG. 20

START

CREATE A NEW REFERENCE PARTS LIST FOR A NEW REFERENCE POINT IN TIME — 2100

END

FIG. 21

START

2200 — IDENTIFY CHANGE LISTS BETWEEN THE CURRENT REFERENCE POINT IN TIME AND THE NEW REFERENCE POINT IN TIME

2202 — ADD PARTS IN ADDITION LISTS IN THE CHANGE LISTS TO THE REFERENCE PARTS LIST IN RESPONSE TO THE NEW REFERENCE POINT IN TIME BEING LATER THAN THE CURRENT REFERENCE POINT IN TIME

2204 — SUBTRACT PARTS IN SUBTRACTION LISTS IN THE CHANGE LISTS FROM THE REFERENCE PARTS LIST IN RESPONSE TO THE NEW REFERENCE POINT IN TIME BEING LATER THAN THE REFERENCE POINT IN TIME

END

FIG. 22

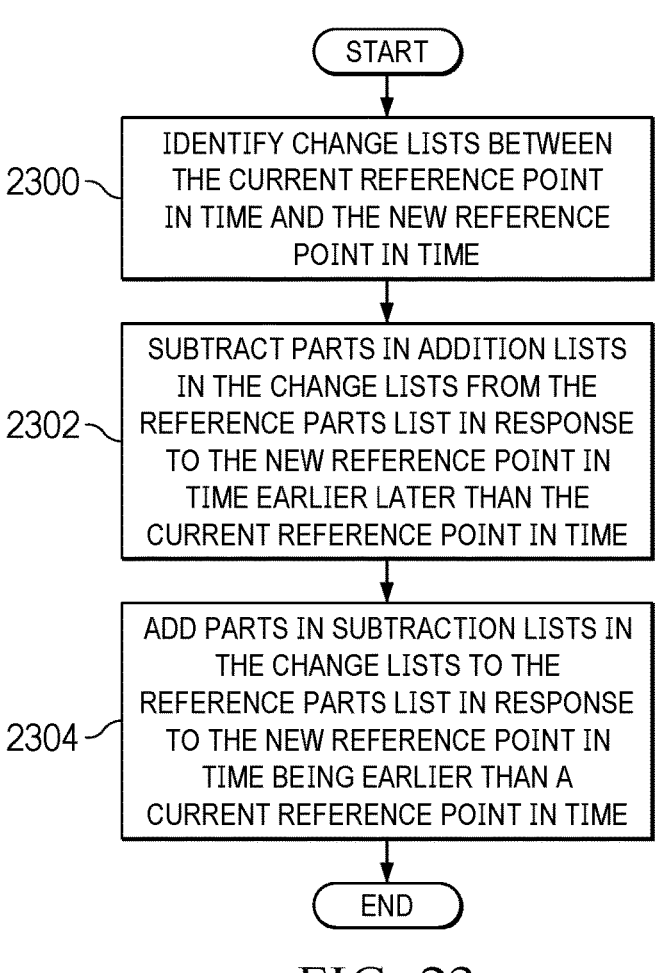

START

2300 — IDENTIFY CHANGE LISTS BETWEEN THE CURRENT REFERENCE POINT IN TIME AND THE NEW REFERENCE POINT IN TIME

2302 — SUBTRACT PARTS IN ADDITION LISTS IN THE CHANGE LISTS FROM THE REFERENCE PARTS LIST IN RESPONSE TO THE NEW REFERENCE POINT IN TIME EARLIER LATER THAN THE CURRENT REFERENCE POINT IN TIME

2304 — ADD PARTS IN SUBTRACTION LISTS IN THE CHANGE LISTS TO THE REFERENCE PARTS LIST IN RESPONSE TO THE NEW REFERENCE POINT IN TIME BEING EARLIER THAN A CURRENT REFERENCE POINT IN TIME

END

FIG. 23

START

COMPARE A PRIOR ATTRIBUTES LIST FOR THE VEHICLE AT A POINT IN TIME TO A CURRENT ATTRIBUTES LIST — 2400

DETERMINE A SET OF ATTRIBUTE CHANGE LISTS FOR THE ATTRIBUTES THAT CHANGED USING THE COMPARISON THAT DETERMINES THE CHANGE IN THE ATTRIBUTES FOR THE PARTS — 2402

END

2602 — SPECIFICATION AND DESIGN

2604 — MATERIAL PROCUREMENT

2606 — COMPONENT AND SUBASSEMBLY MANUFACTURING

2608 — SYSTEM INTEGRATION

2610 — CERTIFICATION AND DELIVERY

2612 — IN SERVICE

2614 — MAINTENANCE AND SERVICE

2700

AIRCRAFT

2702 — AIRFRAME     INTERIOR — 2706

SYSTEMS

PROPULSION SYSTEM     ELECTRICAL SYSTEM 2708   2712     2710   2714

HYDRAULIC SYSTEM     ENVIRONMENTAL SYSTEM

2704

TEMPORAL BASED
MULTICONFIGURATION DATASET SYSTEM

BACKGROUND INFORMATION

1. Field

The present disclosure relates generally to an improved computer system and in particular, to a temporal based multi-configuration dataset system for managing vehicle three dimensional model datasets over time.

2. Background

Large three-dimensional model datasets are used to display three-dimensional visualization of vehicles such as a commercial airplane. A massive model dataset may have models from thousands to millions of parts. These types of datasets are also referred to as massive model datasets.

During the design development of an aircraft, a significant difference in parts can occur from one point in time to the end point in time in these massive model datasets. These massive model datasets can also be used during the manufacturing process for a commercial airplane. These models allow users to visualize the commercial airplane to perform different operations. For example, system designers can quickly visualize design changes during development of the commercial airplane. Assembly mechanics can use three-dimensional visualization of the datasets to monitor progress during assembly of the commercial airplane. As another example, maintenance technicians use three-dimensional visualization and associated data to track maintenance while the commercial airplane is in service.

Currently, a massive model dataset for an aircraft comprises a snapshot in time for a configuration of the aircraft. Each snapshot comprises the models present for that particular point in time. As the number of configurations increase for different points in time for the aircraft, the number of massive model datasets of those configurations at the different points in time increase. As result, the resources needed for processing the increased number of models also increases. For example, the amount of storage needed to store the massive model datasets increase.

Further, each time visualizing a configuration of the commercial airplane at another point in time occurs, a massive model dataset for that configuration is sent over network. As result, when requesting multiple points in time, the amount of bandwidth needed on the network to transmit these different configurations to a workstation also increases.

Further, the level of effort required to understand what differences between the different points in time that have been introduced by design and other change is large and avoidable.

Therefore, it would be desirable to have a method, apparatus, and system that take into account at least some of the issues discussed above, as well as other possible issues. For example, it would be desirable to have a method, apparatus, and system that overcome a technical problem associated with the number of resources needed for using massive model datasets.

SUMMARY

An example of the present disclosure provides a temporal multi-configuration model dataset system that comprises a computer system. The computer system is configured to compare a prior parts list for a vehicle at a point in time to a current parts list in which comparing of the prior parts list with the current parts list results in a comparison that detects a change in parts for the vehicle. The computer system is configured to determine a set of change lists for the parts that changed using the comparison that detects the change in the parts. The set of change lists is relative to a reference parts list for a reference point in time. The computer system is configured to append a set of models to a model dataset for the vehicle in response to a set of the parts added to the vehicle in the comparison such that such that the model dataset is updated. The set of models correspond to the set of the parts added to the vehicle and wherein the models are not removed from the model dataset in response to parts being removed from the vehicle in the comparison. The computer system is configured to determine display parts in the model dataset present for a selected point in time in response to receiving a request to visualize the vehicle at the selected point in time in which the display parts are determined using the set of change lists. The computer system is configured to display a visualization of the vehicle using the display parts determined to be present for the selected point in time on a display system. According to other illustrative examples, a method and a computer program product for managing a multi-configuration model dataset are provided.

Another example of the present disclosure provides a temporal multi-configuration model system comprising a computer system. The computer system is configured to receive a selected point in time for visualizing a vehicle. The computer system is configured to determine display parts in a model dataset present for a selected point in time in response to receiving a request to visualize the vehicle at the selected point for a visualization of the vehicle in which the display parts are determined using a set of subtraction lists determined from a current point in time to the selected point in time. The set of subtraction lists is for parts removed from the vehicle from the current point in time to the selected point in time. The computer system is configured to display the model dataset on a display system at the selected point in time using the display parts for the parts present at the selected point in time. The model dataset comprises models for the parts added to the vehicle over time without removing models from the model dataset in response to parts being removed from the vehicle. According to other illustrative examples, a method and a computer program product for visualizing a multi-configuration model dataset are provided.

Yet another example of the present disclosure provides a product management system. The product management system comprises a control system. The control system operates to compare a prior parts list for a vehicle at a point in time to a current parts list in which comparing of the prior parts list with the current parts list results in a comparison that detects a change in parts for the vehicle; determine a set of change lists for the parts that changed using the comparison that detects the change in the parts, wherein the set of change lists is relative to a reference parts list for a reference point in time; append a set of models to a model dataset for the vehicle in response to a set of the parts added to the vehicle in the comparison such that the model dataset is updated, wherein the set of models correspond to the set of the parts added to the vehicle and wherein models are not removed from the model dataset in response to parts being removed from the vehicle in the comparison; determine display parts in the model dataset present for a selected point in time in response to receiving a request to visualize the vehicle at the selected point in time in which the display parts are determined using the set of change lists; and display a visualization of the vehicle using the display parts determined to be present for the selected point in time on a display system.

The features and functions can be achieved independently in various examples of the present disclosure or may be combined in yet other examples in which further details can be seen with reference to the following description and drawings.

BRIEF DESCRIPTION OF THE DRAWINGS

The novel features believed characteristic of the illustrative examples are set forth in the appended claims. The illustrative examples, however, as well as a preferred mode of use, further objectives and features thereof, will best be understood by reference to the following detailed description of an illustrative example of the present disclosure when read in conjunction with the accompanying drawings, wherein:

FIG. 17 is an illustration of a flowchart of a process determining display parts for a point in time other than a current point in time in accordance with an illustrative example;

FIG. 18 is an illustration of a flowchart of a process determining display parts in accordance with an illustrative example;

FIG. 19 is an illustration of a flowchart of a process determining display parts in accordance with an illustrative example;

FIG. 20 is an illustration of a flowchart of a process for displaying graphical indicators in accordance with an illustrative example;

FIG. 21 is an illustration of a flowchart of a process for changing a reference point in time in accordance with an illustrative example;

FIG. 22 is an illustration of a flowchart of a process for changing a reference point in time in accordance with an illustrative example;

FIG. 23 is an illustration of a flowchart of a process for changing a reference point in time in accordance with an illustrative example;

FIG. 24 is an illustration of a flowchart of a process for managing attributes associated with parts in the model dataset for the vehicle in accordance with an illustrative example.

DETAILED DESCRIPTION

Figure 1:
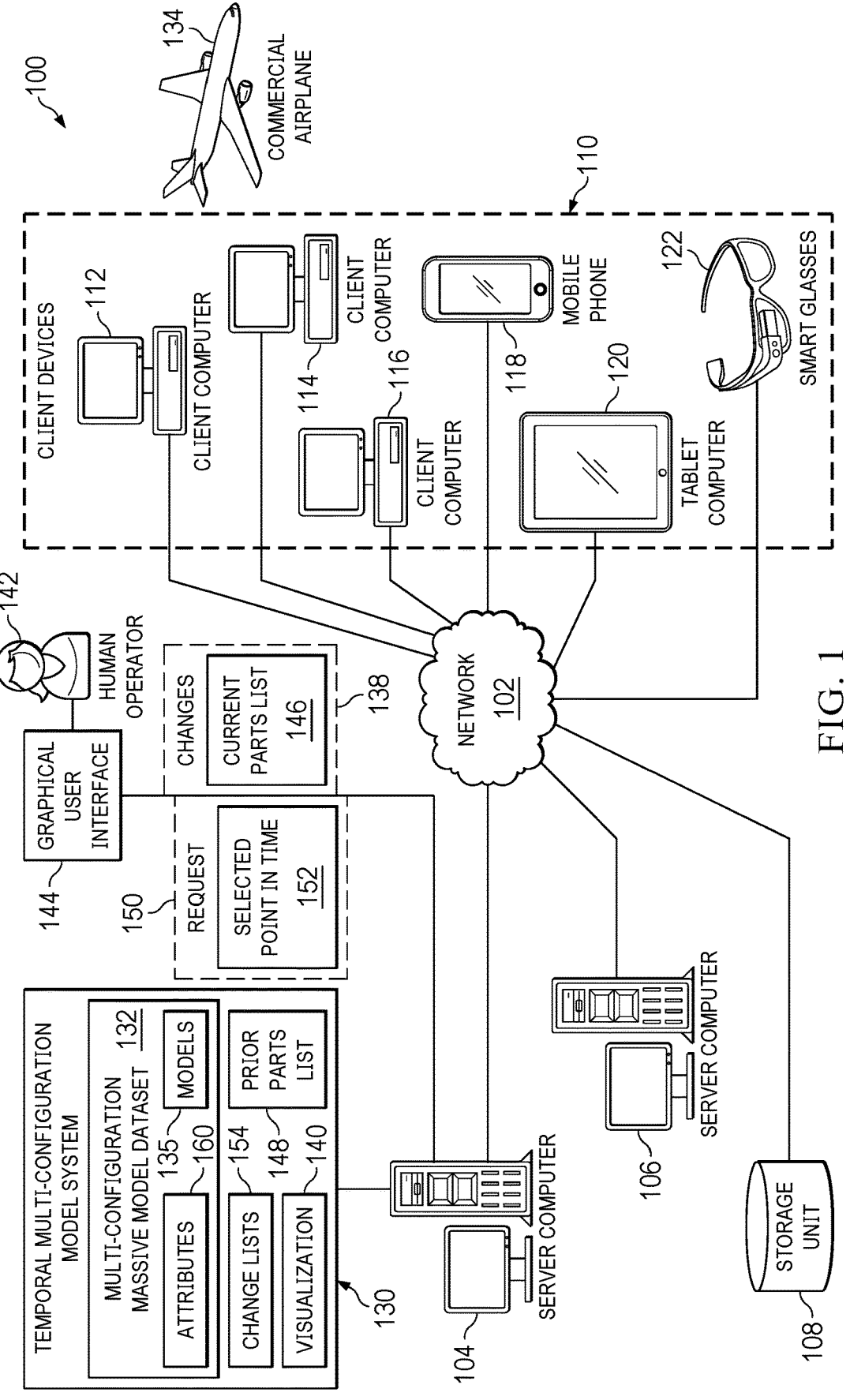
FIG. 1 is a pictorial representation of a network of data processing systems in which illustrative examples may be implemented.

The illustrative examples recognize and take into account a number of different considerations as described below. For example, the illustrative examples recognize and take into account that when designers work with models, the computer aided design (CAD) data used by the designers is from a single snapshot in time. As the design evolves over time, the models or list of models used in the commercial airplane change. Currently no easy way presently to visualize how or when that change occurred. Access to review these design changes can be useful in situations where requirements have changed or assumptions made earlier in the design process turned out to be incorrect.

Image-based archives of prior designs are used in some cases. With these images-based archives, a human operator can access the images but not the three-dimensional model geometry or attributes. This current approach does not provide desired amount of access to the three-dimensional models or attributes to fully explore the state of the design for a particular point in time.

Another solution can build up individual models involving a series of steps that can be rolled back to a specific stage. However, individual assemblies produced by different design engineers are not time synchronized. Further, once an assembly of models are put into a release form, most if not all of the design history is lost, especially in situations when the three-dimensional models are created by different computer-aided design applications and are brought together for a full digital pre-assembly design review. This type of solution may work for smaller subassemblies, but the solution is not scalable for large system integration projects that may involve the visualization of an entire product such as a commercial airplane.

Thus, illustrative examples provide a method, apparatus, and system for temporal based multi configuration dataset creation and visualization. An example a temporal multi-configuration model dataset system that comprises a computer system. The computer system is configured to compare a prior parts list for a vehicle at a point in time to a current parts list in which comparing of the prior parts list with the current parts list results in a comparison that detects a change in parts for the vehicle. The computer system is configured to determine a set of change lists for the parts that changed using the comparison that detects the change in the parts. In this example, the comparison detects if a change in the parts has taken place, determines if the list of parts has changed, or detects if a change in the parts has taken place and determines if the list of parts has changed. The set of change lists is relative to a reference parts list for a reference point in time. The computer system is configured to append a set of models to a model dataset for the vehicle in response to a set of the parts added to the vehicle in the comparison such that such that the model dataset is updated. The set of models correspond to the set of the parts added to the vehicle and wherein the models are not removed from the model dataset in response to parts being removed from the vehicle in the comparison. The computer system is configured to determine display parts in the model dataset present for a selected point in time in response to receiving a request to visualize the vehicle at the selected point in time in which the display parts are determined using the set of change lists. The computer system is configured to display a visualization of the vehicle using the display parts determined to be present for the selected point in time on a display system. According to other illustrative examples, a method and a computer program product for managing a multi-configuration model dataset are provided.

With reference now to the figures and, in particular, with reference to FIG. 1, a pictorial representation of a network of data processing systems is depicted in which illustrative examples may be implemented. Network data processing system 100 is a network of computers in which the illustrative examples may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server computer 104 and server computer 106 connect to network 102 along with storage unit 108. In addition, client devices 110 connect to network 102. As depicted, client devices 110 include client computer 112, client computer 114, and client computer 116. Client devices 110 can be, for example, computers, workstations, or network computers. In the depicted example, server computer 104 provides information, such as boot files, operating system images, and applications to client devices 110. Further, client devices 110 can also include other types of client devices such as mobile phone 118, tablet computer 120, and smart glasses 122. In this illustrative example, server computer 104, server computer 106, storage unit 108, and client devices 110 are network devices that connect to network 102 in which network 102 is the communications media for these network devices. Some or all of client devices 110 may form an Internet of things (IoT) in which these physical devices can connect to network 102 and exchange information with each other over network 102.

Client devices 110 are clients to server computer 104 in this example. Network data processing system 100 may include additional server computers, client computers, and other devices not shown. Client devices 110 connect to network 102 utilizing at least one of wired, optical fiber, or wireless connections.

Program instructions located in network data processing system 100 can be stored on a computer-recordable storage media and downloaded to a data processing system or other device for use. For example, program instructions can be stored on a computer-recordable storage media on server computer 104 and downloaded to client devices 110 over network 102 for use on client devices 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, governmental, educational, and other computer systems that route data and messages. Of course, network data processing system 100 also may be implemented using a number of different types of networks. For example, network 102 can be comprised of at least one of the Internet, an intranet, a local area network (LAN), a metropolitan area network (MAN), or a wide area network (WAN). FIG. 1 is intended as an example, and not as an architectural limitation for the different illustrative examples.

As used herein, "a number of" when used with reference to items, means one or more items. For example, "a number of different types of networks" is one or more different types of networks.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In this illustrative example, temporal multi-configuration model system 130 is located in server computer 104. Temporal multi-configuration model system 130 can manage multi-configuration massive model dataset 132 for commercial airplane 134. Multi-configuration massive model dataset 132 is a collection of models 135 for commercial airplane 134. In this example, models 135 are three-dimensional models such as computer aided design (CAD) models.

As a massive model dataset, multi-configuration massive model dataset 132 can have many models for thousands to millions of parts for commercial airplane 134. As a multi-configuration massive model dataset, this dataset can have models representing multiple configurations for commercial airplane 134.

In this example, the multiple configurations for commercial airplane 134 stored in multi-configuration massive model dataset 132 are for configurations of commercial airplane 134 over different points in time. In this illustrative example, configuration of commercial airplane 134 changes over time during the design, manufacturing, or other phases in the life cycle of commercial airplane 134.

By tracking multiple configurations for commercial airplane 134, human operator 142 can see how commercial airplane 134 changes over the design process or while commercial airplane 134 is in service. For example, design changes to the design for commercial airplane 134 can be seen over different points in time using multi-configuration massive model dataset 132. In this manner, human operator 142 can see when various changes are implemented or made to the design of commercial airplane 134.

As another example, in tracking changes to commercial airplane 134 during routine maintenance and service, which may include modification, reconfiguration, refurbishment, and other maintenance or service, can be seen. This type of tracking of commercial airplane 134 can be useful for maintenance planning, certification, and resell of commercial airplane 134.

In this illustrative example, as commercial airplane 134 changes over time, changes 138 can be sent to temporal multi-configuration model system 130. Changes 138 to commercial airplane 134 are tracked and managed by temporal multi-configuration model system 130 using multi-configuration massive model dataset 132. In other words, the changes over time are tracked such that visualization 140 can be generated for any point in time for which changes in the configuration have been tracked in multi-configuration massive model dataset 132.

In this illustrative example, multi-configuration massive model dataset 132 does not need to save independent copies of models 135 for each configuration at each point in time. Instead, snapshots are used for the configuration of commercial airplane 134 at different points in time. For example, changes 138 can include a current parts list 146 for commercial airplane 134. Current parts list 146 specifies all of the parts present for the point in time in which changes 138 are sent to temporal multi-configuration model system 130.

Temporal multi-configuration model system 130 can compare this current list to prior parts list 148. Prior parts list 148 is a parts list of the parts present in commercial airplane 134 at the last time a change was made.

This comparison can identify parts added in parts subtracted from commercial airplane 134. This comparison can be made to generate change lists 154, which identify the parts added and parts subtracted. Change lists 154 determined through different comparisons over time or associated with points in time identifying when changes are made. These points in time can be for the parts present during that point in time for commercial airplane 134.

For parts added, models corresponding to the added parts can be appended to the existing models in models 135 in multi-configuration massive model dataset 132. In this example, models 135 are not removed from multi-configuration massive model dataset 132. As result, visualization 140 can be created for any point in time in points in times for different configurations of commercial airplane 134 using change lists 154 to determine the configuration of commercial airplane 134 at that point in time for which change lists 154 are present.

In this illustrative example, a user, such as human operator 142, can visualize commercial airplane 134 on graphical user interface 144 in server computer 104 at different points in time. For example, human operator 142 can send request 150 for a visualization of commercial airplane 134 at selected point in time 152 to temporal multi-configuration model system 130 in server computer 104.

In response receiving request 150 with selected point in time 152, temporal multi-configuration model system 130 generates visualization 140 of commercial airplane 134 from models 135 within multi-configuration massive model dataset 132 using change lists 154. Visualization 140 can be displayed on graphical user interface 144 to human operator 142 at server computer 104.

In some illustrative examples, attributes 160 can also be contained in multi-configuration massive model dataset 132. For example, multi-configuration massive model dataset 132 can have one grouping for models 135 in another grouping for attributes 160. In this illustrative example, these attributes can be included for parts in current parts list 146 and prior parts list 148. Attributes 160 can also be present in change lists 154 and associated with points in time. As result, changes in attributes 160 can also be identified for different points in time.

In another illustrative example, multi-configuration massive model dataset 132 can be stored in client computer 112 instead of at server computer 104. In another example, a human operator can be located at client computer 112. With this example, visualization 140 can be generated on client computer 112 for display to human operator 142.

Thus, temporal multi-configuration model system 130 can enable selective visualization of three-dimensional models in multi-configuration datasets such as multi-configuration massive model dataset 132. Further, the use of multi-configuration massive model dataset 132 containing all of models 135 for parts added and subtraction lists in change lists 154 associated with points in time for parts removed can enable visualizing the state of commercial airplane 134 at a specific point in time.

Thus, human operators such as system designers, assembly mechanics, maintenance technicians, or other human operators can quickly visualize design changes during the development or manufacturing of commercial airplane 134. Design changes or actual changes to commercial airplane 134 can also be tracked for existing vehicles that undergo configuration changes based on maintenance that it can include modification, reconfiguration, refurbishment, and other maintenance or service in which parts are at least one of changed, added, or removed from commercial airplane 134.

As result, multi-configuration massive model dataset 132 can be used to track commercial airplane 134 while in service as part of keeping maintenance records and documentation. In this manner, a history of commercial airplane 134 can be maintained for various purposes during the lifecycle of commercial airplane 134. With the use of multi-configuration massive model dataset 132, the amount of memory or other storage needed to store individual snapshots of commercial airplane 134 at different points in time can be reduced by tracking the changes or deltas. Tracking the changes or deltas results in avoiding a requirement to store entire set of models for each configuration of commercial airplane 134 at different points in time as with current systems.

Figure 2:
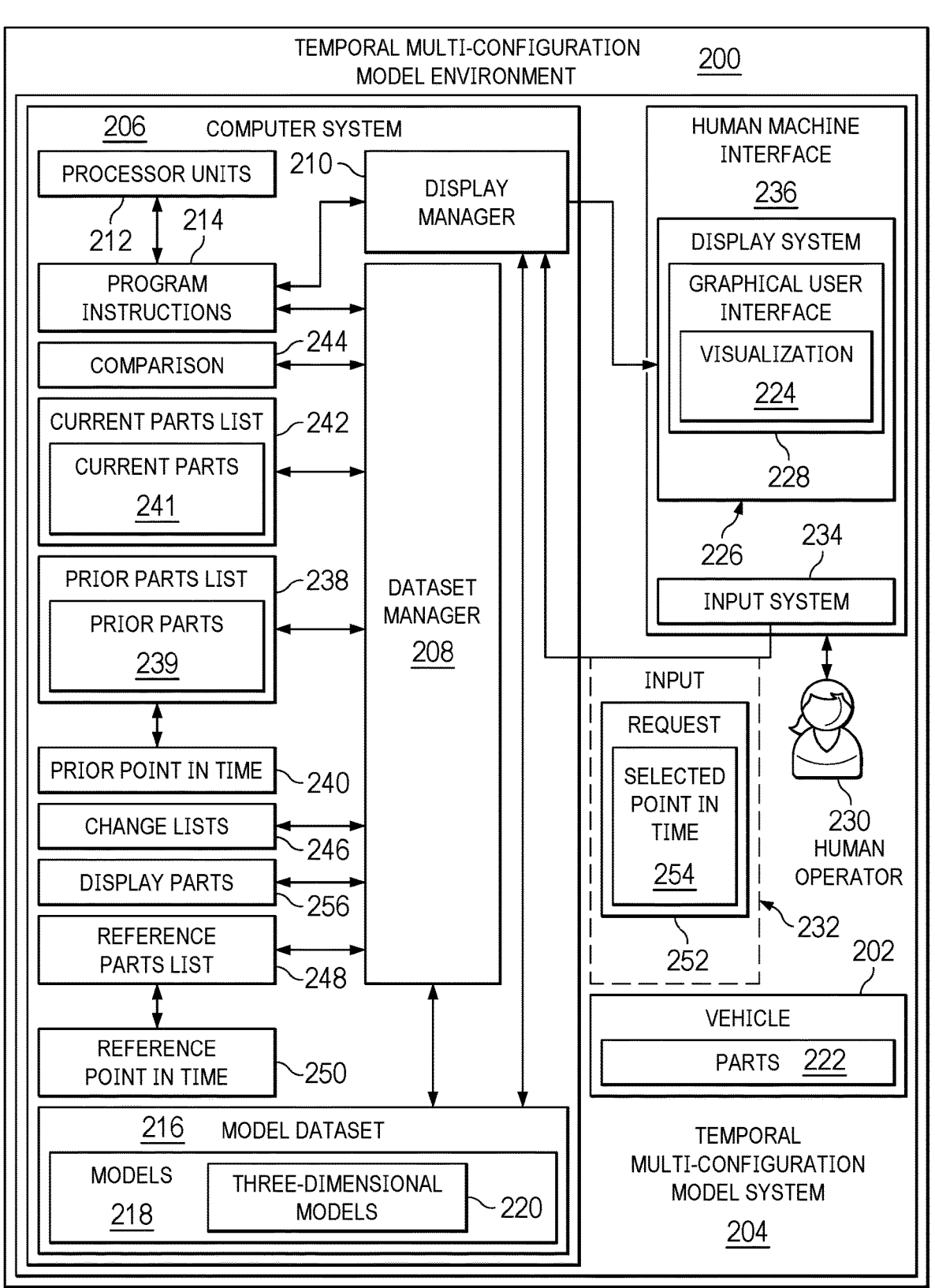
FIG. 2 is a block diagram of a temporal multi-configuration model environment in accordance with an illustrative example.

With reference now to FIG. 2, a block diagram of a temporal multi-configuration model environment is depicted in accordance with an illustrative example. In this illustrative example, temporal multi-configuration model environment 200 includes components that can be implemented in hardware such as the hardware shown in network data processing system 100 in FIG. 1. This environment is an environment in which the displaying of vehicle 202 can be made for different configurations for vehicle 202 using temporal multi-configuration model system 204.

In this illustrative example, vehicle 202 can take a number of different forms. For example, vehicle 202 can be selected from a group comprising an aircraft, a tilt-rotor aircraft, a tilt wing aircraft, a vertical takeoff and landing aircraft, an electrical vertical takeoff and landing vehicle, a personal air vehicle, a surface ship, a tank, a personnel carrier, a train, a spacecraft, a space station, a submarine, a bus, an automobile, and other suitable types of vehicles.

In this illustrative example, temporal multi-configuration model system 204 comprises computer system 206, dataset manager 208, and display manager 210. Dataset manager 208 and display manager 210 can be implemented in software, hardware, firmware or a combination thereof. When software is used, the operations performed by dataset manager 208 and display manager 210 can be implemented in program instructions configured to run on hardware, such as a processor unit. When firmware is used, the operations performed by dataset manager 208 and display manager 210 can be implemented in program instructions and data and stored in persistent memory to run on a processor unit. When hardware is employed, the hardware can include circuits that operate to perform the operations in dataset manager 208.

In the illustrative examples, the hardware can take a form selected from at least one of a circuit system, an integrated circuit, an application specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field programmable logic array, a field programmable gate array, and other suitable hardware devices. Additionally, the processes can be implemented in organic components integrated with inorganic components and can be comprised entirely of organic components excluding a human being. For example, the processes can be implemented as circuits in organic semiconductors.

Computer system 206 is a physical hardware system and includes one or more data processing systems. When more than one data processing system is present in computer system 206, those data processing systems are in communication with each other using a communications medium. The communications medium can be a network. The data processing systems can be selected from at least one of a computer, a server computer, a tablet computer, or some other suitable data processing system.

As depicted, computer system 206 includes a number of processor units 212 that are capable of executing program instructions 214 implementing processes in the illustrative examples. As used herein a processor unit in the number of processor units 212 is a hardware device and is comprised of hardware circuits such as those on an integrated circuit that respond and process instructions and program code that operate a computer. When a number of processor units 212 execute program instructions 214 for a process, the number of processor units 212 is one or more processor units that can be on the same computer or on different computers. In other words, the process can be distributed between processor units on the same or different computers in a computer system. Further, the number of processor units 212 can be of the same type or different type of processor units. For example, a number of processor units can be selected from at least one of a single core processor, a dual-core processor, a multi-processor core, a general-purpose central processing unit (CPU), a graphics processing unit (GPU), a digital signal processor (DSP), or some other type of processor unit.

In this illustrative example, dataset manager 208 manages model dataset 216 for vehicle 202. In this illustrative example, dataset manager 208 can add or remove models 218 from model dataset 216.

In this illustrative example, models 218 represent parts 222 for vehicle 202. Models 218 are three-dimensional models 220 in this example and can be, for example, computer aided design models.

Parts 222 can be selected from at least one of an assembly, a wheel, a wiring system, a spar, a wing box, a rib, a panel, a door, a cabinet, a monument, an engine housing, a flap, a light strip, a computer, an environmental control system, or some other suitable type of structure or system. The selection of what components form a part depends on the desired granularity.

As depicted, display manager 210 can operate to generate visualization 224 of vehicle 202 using models 218 for parts 222 in vehicle 202. In the illustrative example, display manager 210 can cause the display of visualization 224 in graphical user interface 228 on display system 226.

Display system 226 is a physical hardware system and includes one or more display devices on which graphical user interface 228 can be displayed to human operator 230. The display devices can include at least one of a light emitting diode (LED) display, a liquid crystal display (LCD), an organic light emitting diode (OLED) display, a computer monitor, a projector, a flat panel display, a heads-up display (HUD), a head-mounted display (HMD), or some other suitable device that can output information for the visual presentation of information, such as visualization 224.

Human operator 230 is a person that can interact with graphical user interface 228 through input 232 generated by input system 234. Input system 234 is a physical hardware system and can be selected from at least one of a mouse, a keyboard, a touch pad, a trackball, a touchscreen, a stylus, a motion sensing input device, a gesture detection device, a data glove, cyber glove, a haptic feedback device, or some other suitable type of input device. Display system 226 and input system 234 form human machine interface (HMI) 236.

In this illustrative example, dataset manager 208 in computer system 206 compares prior parts list 238 for vehicle 202 at prior point in time 240 to current parts list 242. The comparing of prior parts list 238 with current parts list 242 results in a comparison 244 that detects a change in parts 222 for vehicle 202. A result of comparing prior parts list 238 with current parts list 242 is that comparison 244 identifies the set of changes between prior parts 239 in prior parts list 238 and current parts 241 in current parts list 242 for vehicle 202. In this example, a forward-looking set of changes is generated.

In the illustrative example, the comparison to identify parts 222, can also work in reverse to generate a backwards-looking set of changes. The comparison on to identify parts 222 detects at least one of changes in parts 222 or changes of parts 222 in current parts lists 242. In this example, to recreate a visualization for a prior point in time from a later point in time, the items in an addition list for added parts in change lists 246 are subtracted and the items in a subtraction list in change lists 246 for removed parts are added.

In this illustrative example, prior parts list 238 can be a parts list from a previous week, day, hour, or other period of time in which a change to vehicle 202 was made. Prior parts list 238 can be the most recent list of parts 222 present in vehicle 202 prior to receiving current parts list 242 for comparison. Current parts list 242 identifies parts currently in vehicle 202 and may include additions or removal of parts 222 from vehicle 202.

Dataset manager 208 can determine a set of change lists 246 for parts 222 that changed using comparison 244 that identifies the change in parts 222. In this illustrative example, set of change lists 246 is relative to reference parts list 248 for reference point in time 250. Reference point in time 250 can be the first time a parts list was generated for vehicle 202. In another illustrative example, this reference point in time can be some other point in time after the initial generation of the parts list for vehicle 202.

In this illustrative example, dataset manager 208 appends a set of models 218 to model dataset 216 for vehicle 202 in response to a set of parts 222 added to vehicle 202 using comparison 244 such that such that model dataset 216 is updated. The set of models 218 correspond to the set of the parts 222 added to vehicle 202.

In this illustrative example, display manager 210 in computer system 206 can receive input 232 with request 252 to display vehicle 202 at selected point in time 254 from human operator 230. In this illustrative example, display manager 210 configured to determine display parts 256 in model dataset 216 present for a selected point in time 254 in response to receiving request 252 to visualize vehicle 202 at selected point in time 254. In this example, display parts 256 are determined using the model dataset 216 and the set of change lists 246.

Display manager 210 generates visualization 224 of vehicle 202 at selected point in time 254 using display parts 256 determined for vehicle 202 at selected point in time. In this illustrative example, display parts 256 in model dataset 216 are models 218 for parts 222 present at selected point in time 254.

In the illustrative example, display manager 210 can cause the display of visualization 224 using display parts 256 determined to be present for selected point in time 254 on display system 226. For example, visualization 224 is displayed in graphical user interface 228 in display system 226 to human operator 230 in this illustrative example.

Figure 3:
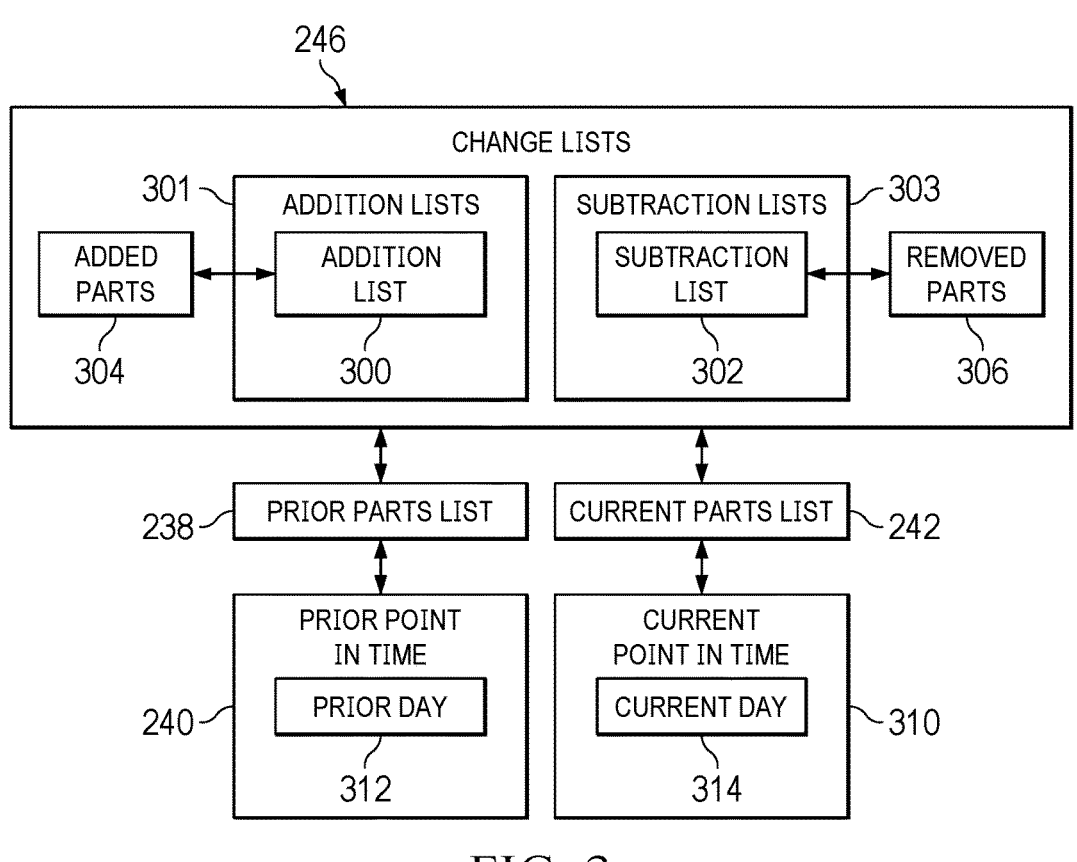
FIG. 3 is an illustration of change lists in accordance with an illustrative example.

With reference now to FIG. 3, an illustration of change lists is depicted in accordance with an illustrative example. In the illustrative examples, the same reference numeral may be used in more than one figure. This reuse of a reference numeral in different figures represents the same element in the different figures.

As depicted, change lists 246 can comprise at addition lists 301 and subtraction lists 303. In one illustrative example, in determining the set of change lists 246, dataset manager 208 can determine addition list 300 in addition lists 301 for set of added parts 304 added to vehicle 202 in response to the set of added parts 304 being identified as added to the vehicle in the set of changes in comparison 244.

In determining the set of change lists 246, dataset manager 208 can determine subtraction list 302 in subtraction lists 303 for a set of removed parts 306 in response to the set of removed parts 306 being identified as removed from vehicle 202 in the set of changes in comparison 244.

In an illustrative example, prior parts list 238 is used in comparisons with current parts list 242 to create change lists 246 such as addition lists 301 and subtraction lists 303. Prior parts list 238 can take a number of different forms. For example, prior parts list 238 can be a parts list for vehicle 202 at prior point in time 240 with respect to current point in time 310. In one example, prior point in time 240 can be prior day 312 and current point in time 310 can be current day 314.

In another example, prior parts list 238 can be all of parts 222 present in model dataset 216 for vehicle 202 as of a last update. In this illustrative example, the last update can be all of parts 222 present in model dataset 216 as of current day 314.

Figure 4:
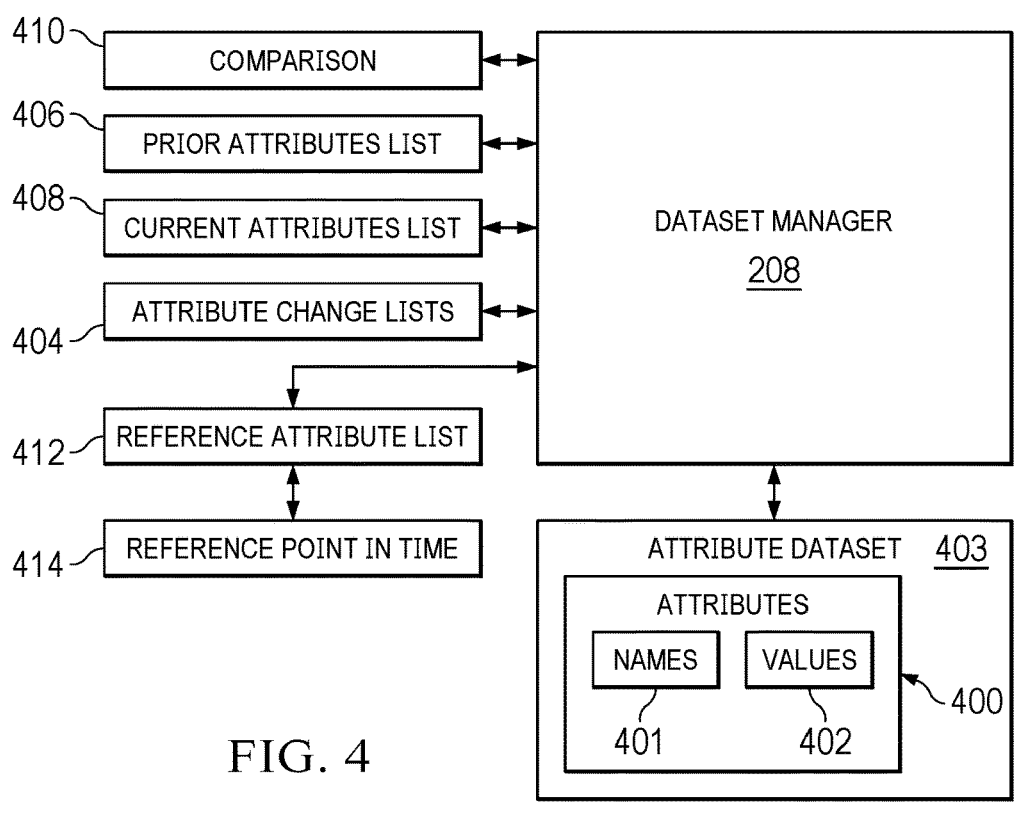
FIG. 4 is an illustration of managing attributes for parts in a in a model dataset in accordance with an illustrative example.

Turning to FIG. 4, an illustration of managing attributes for parts in a in a model dataset is depicted in accordance with an illustrative example. As depicted, attributes 400 can also be present for parts 222 for vehicle 202. Attributes 400 have names 401 and values 402. Attributes 400 can take a number of different forms. For example, attributes 400 can include at least one of a build sequence, a parts identifier, a manufacturer, and identification of materials, processing steps to manufacture a part, and other suitable attributes containing information for a part.

An attribute can have a time element with a sequence value. This type of attribute can be referred to as a time-based attribute. This sequence value can represent a relative time value between 0 and 1 or 0 percent to 100 percent, or some other type of order-based format. Some types of attributes with time-based sequences are build sequence value, lead-time sequence value, procurement sequence value, and other suitable types of attributes. A single part can have more than one of these types of time-based attributes.

These types of attributes can also include levels of hierarchy. For example, an assembly can have an overall time-based build sequence value and each part in the assembly can have its own relative time-based build sequence value. Further, users can enter a range of relative dates that are of interest for display, such as: 0.357-0.431. This other mechanism for representing a point in time could be thought of as relative versus absolute or possibly ordinal or interval time representation.

As depicted, attributes 400 comprising names 401 and values 402 are stored in attribute dataset 403. In another illustrative example, attributes 400 and values 402 can be stored in model dataset 216. The change in attributes 400 recorded in attribute change lists 404 in a similar fashion to change lists 246 for parts 222.

In these illustrative examples, the points in time for attribute change lists 404 can correspond to the point in time for change lists 246. This correspondence can be maintained by including unique identifier in the change lists. For example, a change list and a corresponding attribute change list have the same unique identifier that indicates that these two lists correspond to each other. In one illustrative example, the unique identifiers can be associated with a part at a reference point in time.

Some illustrative examples use a point in time when a part was added to or removed from a vehicle as the trigger for modifying the addition or subtraction lists. In another illustrative example, dataset manager 208 can offer an option (invokable by either a user interface or an application programming interface (API)) such that a model's attribute with a time element and sequence value can have a higher priority versus the point in time when the part was added or removed, for the purpose of determining if the model should be part of a visualization for some chosen point in time. In this illustrative example, a decision process is used for determining if an attribute with a time value has priority over the point in time when the part was added or removed from a vehicle. In this example, the value of an attribute's time element with such priority can be used to determine whether the model should be displayed, instead of using the point in time when the part was added to or removed from the vehicle.

In this example, the value of an attribute's time element with such priority is used to determine when the subtraction list should be modified instead of the point in time when the part was removed from the vehicle. In this example, if a single part has more than one of these time-based attributes then there will be a clear decision process [for determining the relative priority between attributes with time values for determining the addition list. In this example, if a single part has more than one of these time-based attributes then there will be a clear decision process for determining the relative priority between attributes with time values for determining if a part should be displayed or hidden.

In one illustrative example, dataset manager 208 can compare prior attributes list 406 for parts 222 in vehicle 202 to current attributes list 408 for parts 222 in vehicle 202 in which comparing these lists results in comparison 410 that detects a change in attributes 400 for parts 222 in vehicle 202.

With comparison 410, dataset manager 208 can determine a set of attribute change lists 404 that detects a change in attributes 400 for parts 222. The change can include, for example, at least one of new attribute; a deleted attribute; a change in name of an attribute; or change in value of an attribute.

In this example, the set of attribute change lists 404 can be relative to a reference attribute list 412 for reference point in time 414. In this illustrative example, reference point in time 414 can be same or different from reference point in time 250 in FIG. 2. In other words, the management of attribute 400 can be performed independently of the management of models 218.

Figure 5:
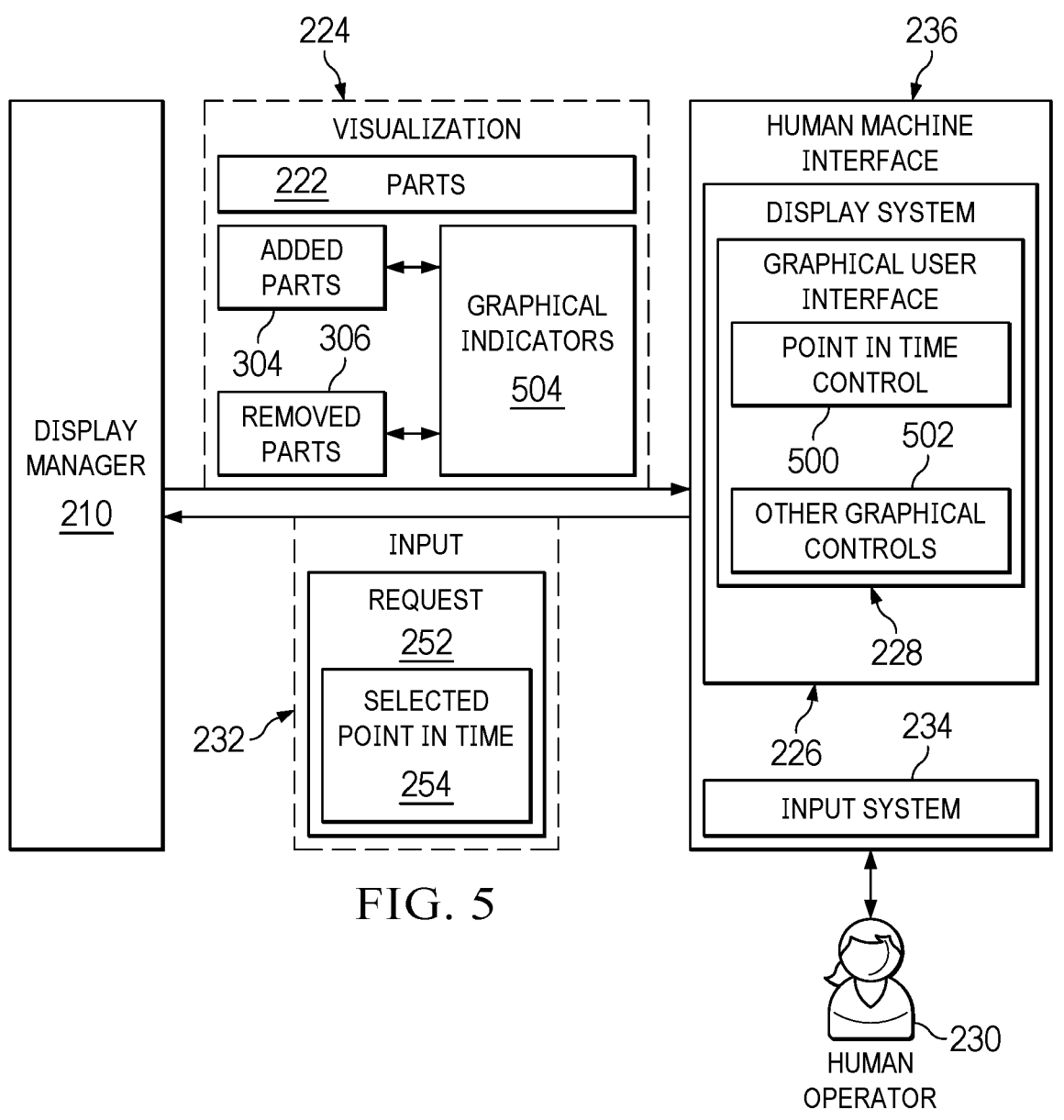
FIG. 5 is an illustration of a visualization in a graphical user interface in accordance with an illustrative example.

Turning to FIG. 5, an illustration of a visualization in a graphical user interface is depicted in accordance with an illustrative example. As depicted, display manager 210 can display visualization 224 in graphical user interface 228. In this illustrative example, point in time control 500 is a graphical control displayed within graphical user interface 228. In this illustrative example, human operator 230 can manipulate point in time control 500 using input system 234 to select selected point in time 254 for visualization 224. As a result of this manipulation of point in time control 500, input system 234 sends input 232 containing request 252 with selected point in time 254 to display manager 210.

In response to receiving input 232, display manager 210 generates and returns visualization 224 to human machine interface 236 for display within graphical user interface 228 in display system 226.

In this illustrative example, visualization 224 comprises parts 222 for vehicle 202 present at selected point in time 254 received in input 232. Further, removed parts 306 can be displayed within visualization 224 using the set of graphical indicators 504. As another example, added parts 304 can also be displayed in visualization 224 using graphical indicators 504.

In another illustrative example, the incremental changes made before or after a selected point in time may be grouped together for a range of times values within the timeline of the dataset. This provides a way to more easily view larger numbers of added or removed parts before and after a specific point in the timeline. In one implementation, this can be accomplished by summing up the lists of added parts in a specified range into one group and lists of subtracted parts in a specified range into another group, and then coloring the parts based on the assigned group color. The prior parts list 238 can be a parts list from a previous week, day, hour, or other period of time in which a change to vehicle 202 was made. Prior parts list 238 can be the most recent list of parts 222 present in vehicle 202 prior to receiving current parts list 242 for comparison. Current parts list 242 identifies parts currently in vehicle 202 and may include additions or removal of parts 222 from vehicle 202.

Graphical indicators 504 can take a number of different forms. For example, graphical indicators 504 can be selected from at least one of an icon, a pictogram, a color, an ideogram, a graphic, an image, text, animation, bolding, a line, an arrow, or other suitable graphic that can draw the attention of human operator 230 to a difference in a particular part from other parts.

In this manner, at least one of added parts 304 are removed parts 306 can be displayed along with parts 222. Graphical indicators 504 enable human operator 230 to distinguish between different types of parts within visualization 224.

For example, added parts 304 added from selected point in time 254 to the current point in time can be displayed using graphical indicators 504. In this manner, human operator 230 can see what parts have been added between the selected point in time 254 with parts in the current point in time.

As another example, removed parts 306 that were removed between selected point in time 254 in FIG. 2 in the current point in time can be displayed using graphical indicators 504 such that human operator 230 can visualize what parts have been removed between the two points in time.

With the display of visualization 224 and graphical user interface 228, human operator 230 can manipulate other graphical controls 502 to manipulate the view of vehicle 202 in visualization 224. Human operator 230 can further manipulate point in time control 500 to cause display manager 210 to generate a new visualization of vehicle 202 at another point in time for display in graphical user interface 228.

In this illustrative example, point in time control 500 and other graphical controls 502 can take a number of different forms. For example, other graphical controls 502 can be selected from at least one of is selected from at least one of a slider, a dial, a scroll bar, a button, check boxes for points in time, a cycle button, a drop down list, a spinner, a command line interface window, or some other suitable type graphical control.

In another illustrative example, other types of control that can be used to select a point in time for the run-time application in addition to or in place of using graphical controls such as point in time control 500. For example, an agent, such as a run-time application, can have an application programming interface (API) that enables connections to a separate application to provide instructions to select selected point in time 254. Further, this application can also allow the execution of instruction scripts, which provide text based commands from a file or from a barcode or quick response (QR) code scanned by a scanner. As a result, users other than human operator 230 can select selected point in time 254 to generate visualization 224 for display in graphical user interface 228 in display system 226.

In one illustrative example, one or more technical solutions are present that overcome a problem with the amount of resources needed for managing model datasets such as massive model datasets. As a result, one or more solutions described in one or more illustrative examples enable reducing the resources needed to create and display massive model datasets when multiple configurations of a vehicle are present in the same model dataset of a vehicle. In the illustrative examples, one or more solutions can reduce the amount of resources needed through maintaining change lists for changes in the configuration of a vehicle stored in a model dataset.

Computer system 206 can be configured to perform at least one of the steps, operations, or actions described in the different illustrative examples using software, hardware, firmware or a combination thereof. As a result, computer system 206 operates as a special purpose computer system in which at least one of dataset manager 208 or display manager 210 in computer system 206 enables reducing the amount of resources needed to manage multiple configurations of a vehicle in a model dataset. In particular, at least one of dataset manager 208 or display manager 210 transforms computer system 206 into a special purpose computer system as compared to currently available general computer systems that do not have at least one of dataset manager 208 or display manager 210.

The illustration of temporal multi-configuration model environment 200 in the different components in FIGS. 2-5 is not meant to imply physical or architectural limitations to the manner in which an illustrative example may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative example.

For example, although dataset manager 208 and display manager 210 are shown as separate functional components, the different operations by these components can be combined into a single component in some illustrative examples. In yet another illustrative example, one or more model datasets for additional vehicles in addition to or in place of vehicle 202 can be present in managed within temporal multi-configuration model system 204. Further, some points in time can be present in which changes do not occur in parts 222 for vehicle 202.

Figure 6:
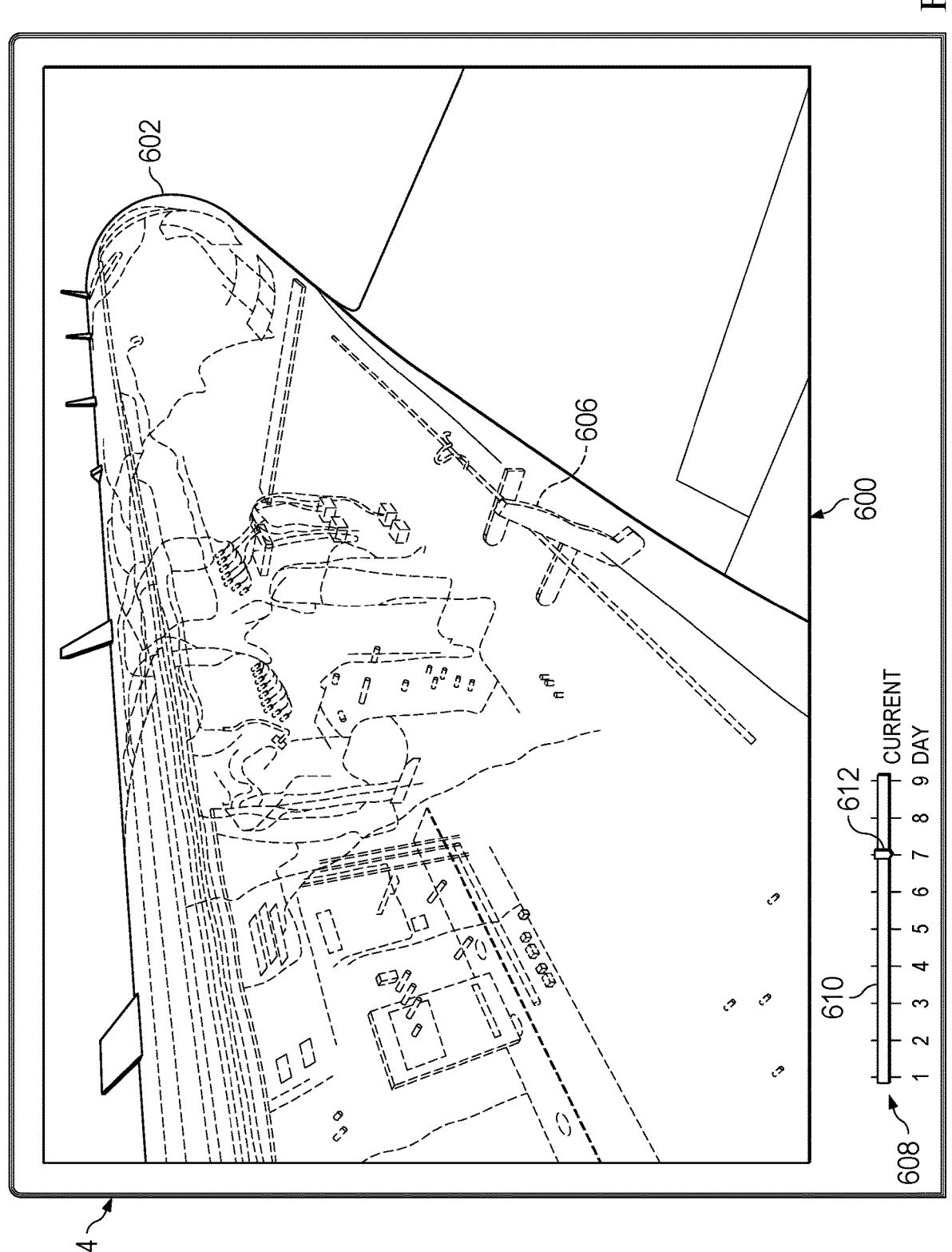
FIG. 6 is an illustration of a visualization of an aircraft in accordance with an illustrative example.

Turning next to FIG. 6, an illustration of a visualization of an aircraft is depicted in accordance with an illustrative example. In this illustrative example, visualization 600 for aircraft 602 in graphical user interface 604 is an example of visualization 224 in graphical user interface 228 for vehicle 202 in the form of aircraft 602.

In this illustrative example, graphical indicator 606 is used to identify parts in aircraft 602 that have been added between the selected point in time in the current point in time. In this illustrative example, graphical indicator 606 can be a color such as blue.

In this illustrative example, slider 608 shown within graphical user interface 604. Slider 608 is an example of an implementation for point in time control 500 in FIG. 5. As depicted, slider 608 comprises bar 610 and indicator 612. As depicted, slider 608 identifies different points in time in the form of days. In this illustrative example, the current day is day 7 in the selected point in time is day 7.

Figure 7:
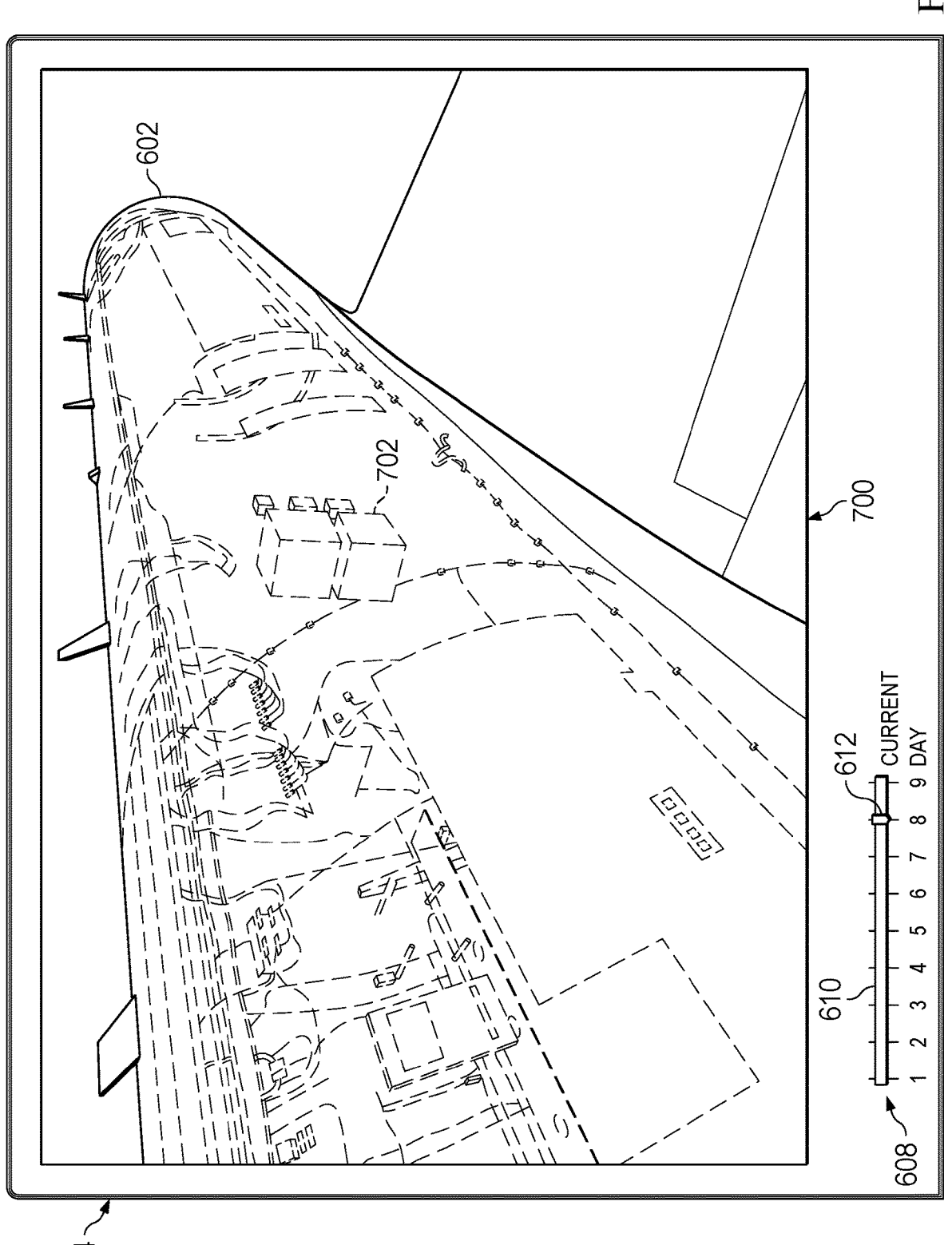
FIG. 7 is an illustration of another visualization of an aircraft in accordance with an illustrative example.

With reference now to FIG. 7, an illustration of another visualization of an aircraft is depicted in accordance with an illustrative example. As depicted, visualization 700 for aircraft 602 in graphical user interface 604 is another example of visualization 224 and graphical user interface 228 in FIG. 2.

In this figure, slider 608 has been manipulated such that indicator 612 has moved from day 7 to day 8 in slider 608.

As result, visualization 700 is now displayed in place of visualization 600 as depicted in FIG. 6. At this point in time, parts that have been removed are identified using graphical indicator 702, which can be, for example, the color red.

Illustration of graphical user interface 604 in FIG. 6 and FIG. 7 is provided is an illustration of one manner in which a graphical user interface can be implemented. This example is not meant to limit the manner in which other illustrative examples can be implemented. For example, in another illustrative example a dial, text box or other graphical control can be used to select the selected point in time for visualization. In yet another illustrative example, graphical indicators indicating added or removed parts may be absent in other visualizations. In yet another example, a selected point in time can be a week, a month, an hour, or some other period of time other than a day.

Figure 8:
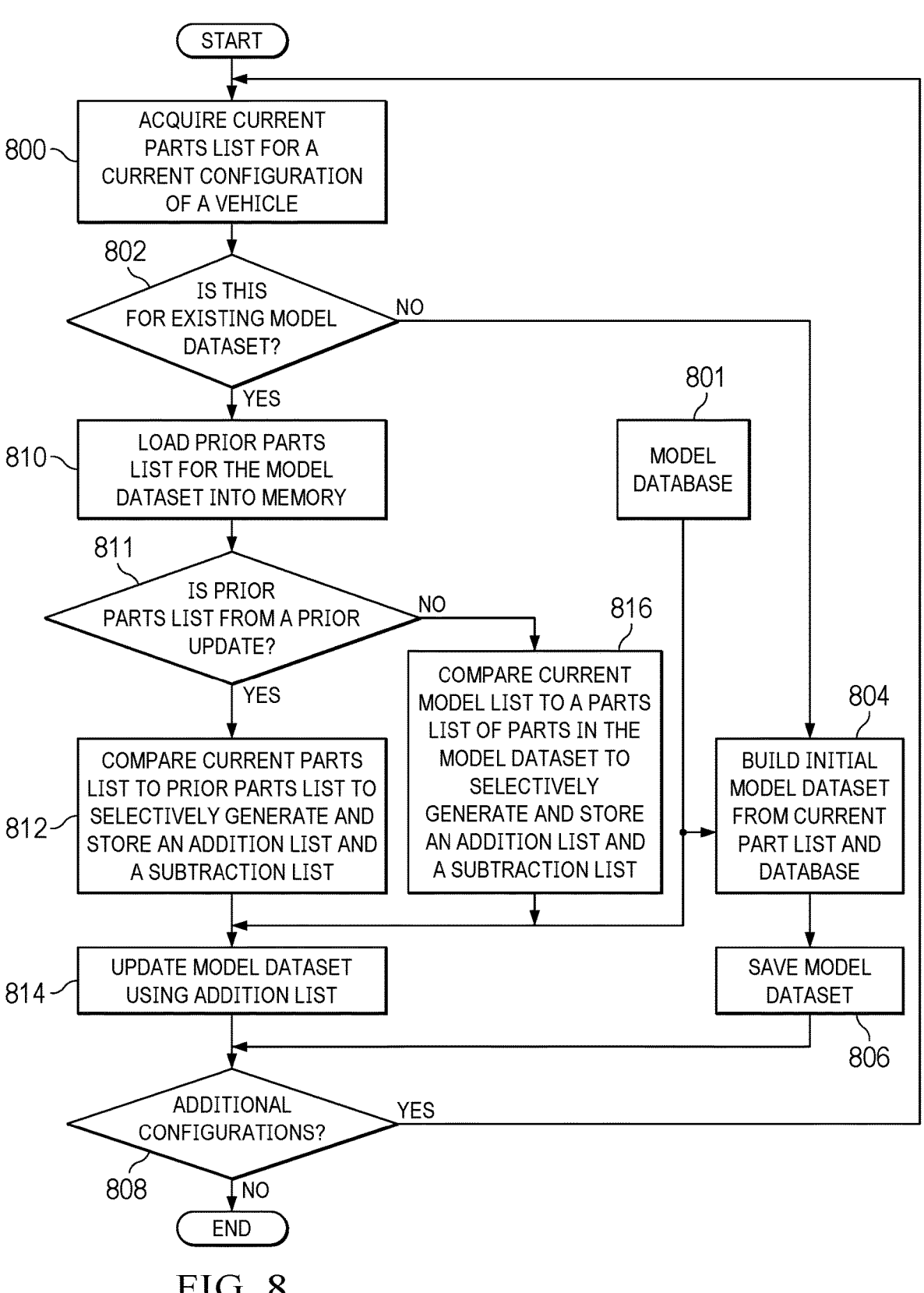
FIG. 8 is an illustration a flowchart of a process for managing a model dataset in accordance with an illustrative example.

Turning next to FIG. 8, an illustration a flowchart of a process for managing a model dataset is depicted in accordance with an illustrative example. The process in FIG. 8 can be implemented in hardware, software, or both. When implemented in software, the process can take the form of program code that is run by one of more processor units located in one or more hardware devices in one or more computer systems. For example, the process can be implemented in at least one of dataset manager 208 in computer system 206 in FIG. 2.

The process begins by acquiring a current parts list for a current configuration of a vehicle (operation 800). The process determines whether the current parts list is for existing model dataset (operation 802). If the current parts list is not for initial model dataset, the process builds initial model dataset from the current parts list and model database 801 (operation 804). In this illustrative example, the model database contains three-dimensional models of parts in the current parts list. The process then saves the model dataset (operation 806). The process determines whether additional configurations are present (operation 808). Operation 808 is used to determine whether additional vehicles are present for processing. This determination takes into account that multiple vehicles may be present. If additional configurations are not present, the process terminates. Otherwise, the process returns to operation 800 as described above.

With reference again to operation 802, if the current parts list is for an existing model dataset, the process loads the prior parts list for the model dataset into memory (operation 810). In this illustrative example the prior parts list in operation 810 is a parts list from a prior point in time in which a comparison was made between in parts the model dataset prior to changes at the point in time as reflected by the current parts list. In other words, the current parts list in this example becomes the prior parts list for comparison in a next point in time. In this example, the prior point in time can be based on a time, such as a day, a week, an hour, or some other period of time. The period of time can also vary in the illustrative example.

A determination is made as to whether prior parts list that is from a prior update (operation 811). If prior parts list is for prior update, the process compares the current parts list to the prior parts list to selectively generate and store in addition list and a subtraction list (operation 812). In operation 812, the current parts list is compared to the prior parts list, which is the list of parts present in the vehicle from the last update parts to the vehicle. These parts lists are selectively generated because an addition list is generated in response to adding one or more parts. The selected generation includes generating a subtraction list of normal parts are removed.

In operation 812, in addition list is generated when one or more parts are added to the vehicle based on the comparison. A subtraction list is generated when a removed from the vehicle based on the comparison.

The process then updates the model dataset using the addition list (operation 814). In this illustrative example, the update in operation 814 involves adding models for any parts that are added to the vehicle. In these illustrative examples, models are not removed from the model dataset when parts are removed from the vehicle. This type of management of the model dataset enables viewing the vehicle at different points in time using the addition list and subtraction list generated based on additions and removal of parts at those points in time.

The process proceeds to operation 808 to determine whether additional configurations are present as previously described. In this manner, the process can continually generate addition and subtraction lists at different points in time.

The comparisons can be made using other mechanisms other than comparing the current parts list to a prior parts list that is from the prior update to the parts for the vehicle as described with respect to operation 812. With reference again to operation 811, if prior parts list is not from a prior update, the process can compare the current parts list to a parts list of the parts in the model dataset to selectively generate and store in addition list and a subtraction list (operation 816). In this example, the current parts list is the list of parts for the vehicle which may have differences between the parts in the model dataset. In other words, the current parts list may contain additions or removals of parts that are not reflected in the model dataset. The process then proceeds to operation 814 as described above.

In some illustrative examples, only a single of type list is present. For example, in one illustrative example, prior parts lists from prior updates are used and not prior parts lists from the parts list of the parts in the model dataset. In another illustrative example, prior parts lists from the parts list of the parts in the model dataset are used and not prior parts lists from prior updates.

Figure 9:
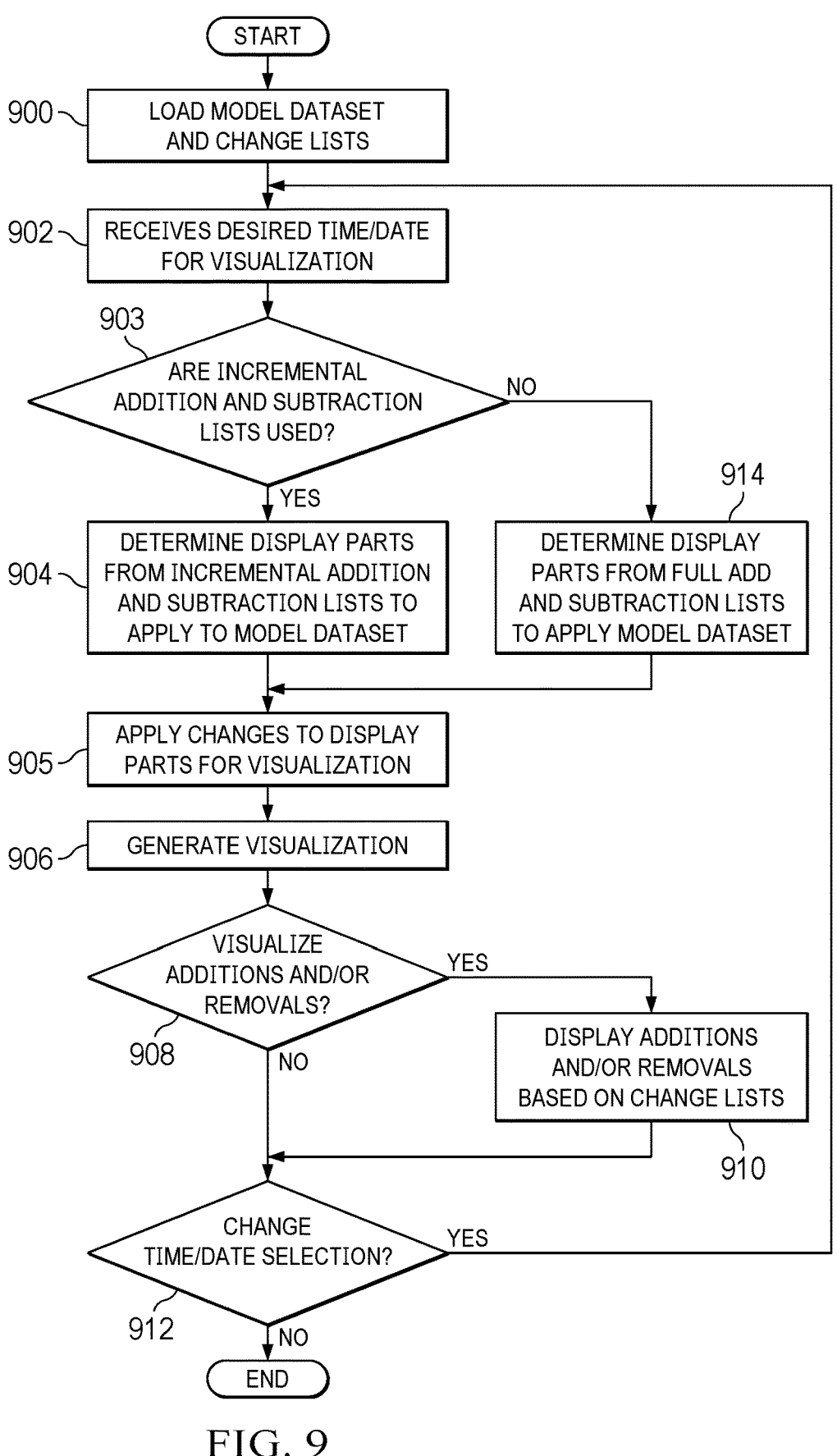
FIG. 9 is an illustration of a flowchart of process for displaying a visualization of a vehicle using a model dataset in accordance with an illustrative example.

With reference next to FIG. 9, an illustration of a flowchart of process for displaying a visualization of a vehicle using a model dataset is depicted in accordance with an illustrative example. The process in FIG. 9 can be implemented in hardware, software, or both. When implemented in software, the process can take the form of program code that is run by one of more processor units located in one or more hardware devices in one or more computer systems. For example, the process can be implemented in at least one of display manager 210 in computer system 206 in FIG. 2.

The process begins by loading the model dataset and change lists (operation 900). The model dataset in operation 900 is for the vehicle for which a visualization is desired.

The process receives a desired time/date for the visualization (operation 902). In operation 902, the time/date is a point in time for which the visualization is desired.

A determination is made as to whether incremental addition and subtraction lists are used (operation 905). If incremental addition and subtraction lists are used, the process determines display parts from the incremental addition and subtraction lists to apply to the model dataset (operation 904). In the illustrative example, the addition and subtraction lists present from the current time/date to the desired time/date are used in operation 904 to identify the parts present at the desired time/date.

In the illustrative example, these addition and subtraction lists are generated based on incremental changes in the parts for the vehicle from one point in time to the next point in time, such as from one day to another day. In this illustrative example, these change lists are generated incrementally as the parts in the vehicle change. For example, these change lists are generated based on the comparison of parts in the vehicle from a current parts list as compared to a prior parts list. The prior parts list contains the parts present in the vehicle prior to the current parts list being generated. The process applies changes to display parts for visualization (operation 905).

The process generates a visualization (operation 906). This visualization is generated in operation 906 based on the display parts identified in operation 904. At this point, the visualization contains the parts present in the vehicle at the desired time/date. In operation 906, the creation of the visualization also includes sending the visualization to a display system for presentation.

The process determines whether to visualize additions and/or removals (operation 908). If additions and/or removals are to be visualized, the process displays additions and/or removals based on the change lists (operation 910). In operation 910, the process can determine what parts have been added and removed and generate graphics data for the visualization. Further, the process can send these additions and/or removals to the display system. With this determination, changes to the vehicle between the current desired time/date in the desired time/date can also be visualized in addition to the parts present in the vehicle at the desired time/date.

The process then determines whether a time/date selection has changed (operation 912). In this operation, another point in time can be selected for visualization. If a change in time/date selection has occurred, the process then returns to operation 902. Otherwise, the process terminates. With reference again to operation 908, if additions and/or removals are not to be visualized, the process also proceeds to operation 912.

In this illustrative example, this process can be performed using addition and subtraction lists generated from comparing the current parts list at different points in time to the parts in the model dataset rather than based on incremental changes from one parts list and another parts list as described in operation 904. With reference to operation 905, if incremental addition and subtraction lists are not used, the process can determine the display parts from full add and subtraction lists to apply to the model dataset (operation 914). In this example, the process assumes a full addition and subtraction are used. In this alternate operation, the subtraction lists are generated by comparing the current parts list to the model dataset for the vehicle.

Thus, with the processes described in FIGS. 7 and 8, changes in a model dataset can be managed in a manner that enables users, such as human operators or software processes, to examine the configuration of the vehicle at different points in time.

For example, using the process in FIG. 7 in dataset manager 208 in temporal multi-configuration model system 204 in FIG. 2, a user can acquire the list of part names for the dataset to create. If parts are for a new model dataset, such as a new build, this point in time can be reference point. This reference point is a starting point in the timeline for tracking configurations of the vehicle. The model dataset is created using this parts list and the models from a model repository.

If current parts list of part names is for an update of an existing model dataset, with a reference point that at an earlier point in time than the current point in time, then the existing model dataset is appended with additional models for parts added to the vehicle. To determine which models to append to the model dataset, a list of parts to add is created. This list is an add list of parts in the current parts list for the current point in time that are not in the prior parts list for parts in the existing model dataset. In other words, the current parts lists can include additions or removal of parts in which these changes are not reflected in the prior parts list.

The prior parts list identifies parts in the vehicle prior to changes that may be made in the current parts list. The addition list for parts to be added is used to instruct the temporal multi-configuration model dataset system which models from the model repository should be added to the model dataset for the vehicle.

During the parts list comparison, a subtraction list is also created, which lists the parts in the existing model dataset that are not in the list for the current point in time. In these illustrative examples, the current parts list can contain added parts, removed parts, or both added and removed parts that are not reflected in the model dataset.

These two change lists, the addition list and the subtraction list, are stored for later reference. The change lists can be used at least one of during run-time operations for visualizing the vehicle or rebuilding a past list for a specific point in time.

This process can be part of a larger batch process that builds multiple model datasets for other vehicles. With this use in mind, the process can check to see whether other model datasets are present that need to be built or updated After the model dataset has been built and change lists have been created, visualizations can be created for vehicles at different points in time using the process in FIG. 8 in temporal multi-configuration model system 204 in FIG. 2. The process starts when a user loads in the model dataset into a visualization application such as display manager 210 in temporal multi-configuration model system 204 in FIG. 2.

The user then selects a point in time, and the process makes the appropriate subtractions of parts in the model dataset to determine display parts in the model dataset for the visualization. The process for creating the subtractions can happen in two ways, either from summation of incremental subtraction lists (from the prior time periods, as shown in Example 1 below) or from a subtraction list created by comparing the current list to the full list (as shown in Example 2 below). The resulting subtractions for that specific time period will be the same, but the method to create them is different.

The process then displays the appropriate models in the model dataset for the vehicle for the selected time period. Optionally, as described in FIG. 8, the user may choose to display parts that have changed (additions or removals) from the previous point in time such as a previous day or show the changes that will happen on the next point in time, such as the day, when the changes are made to the model dataset. This next day assumes the selected time point is not the end of the timeline. If visualization of the vehicle at other points in time are desired, the process repeats, otherwise the method ends.

Example 1

In this first example, change lists are generated as incremental change lists in which the current parts list is compared to a prior parts list in which the prior parts list is the list of parts from the prior point in time. In this example, points in time are days.

Day 1 is a reference day. In this illustrative example, the reference day is the start of the timeline associated with the dataset.

The parts list on day 1 is A,B,C,D,E. Day 1 changes from prior day for removed parts are none and added parts are none. Day 1 parts now in the model dataset are prior day's model dataset because no parts were added (A,B,C,D,E)=A,B,C,D,E.

To view day 1 parts, the process loads model dataset. Parts are not subtracted because there are no changes. The parts for visualization are A,B,C,D,E.

On day 2, the current parts list for this specific day is A,B,D,E,F,G. Day 2 changes from prior day are removed parts are C and added parts are F,G. Day 2 parts now in the updated model dataset are prior day's full dataset plus added parts (F,G). The updated model dataset is A,B,C,D,E,F,G after making changes using the current parts list.

To view day 2 parts, the process loads model dataset and subtracts day 2 removed parts (C). The display parts are A,B,D,E,F,G. To visualize changes from prior day: color day 2 added parts one color (such as blue), day 2 removed parts another color (such as red).

On day 3, the current parts list for this specific day is A,B,D,E,G,H,I,J. Day 3 changes from prior day are removed parts are F and added parts are H,I,J. Day 3 parts now in the updated model dataset are the model dataset from the prior day (A,B,C,D,E,F,G) plus added parts (H,I,J)=A,B,C,D,E,F,G,H,I,J.

To visualize day 3 parts, the process loads model dataset and subtracts day 2 removed parts (C) and day 3 removed parts (F)=A,B,D,E,G,H,I,J.

The determination of the display parts can be made as follows:

$$\text{current\_day} = \text{full\_dataset} - \Sigma\text{removed\_parts}(\text{day 1 to day } n) \tag{1}$$

wherein the current_day are the display parts, full dataset are the parts in the model dataset, and removed_parts(day 1 to day n) are parts to be removed from day 1 to day n, where n is the selected day for visualization.

In this example, in visualizing changes from prior day, the process colors day 3 added parts in blue and colors day 3 removed parts in red.

To visualize day 2 now that the process is at day 3, the process loads the model dataset and subtract day 3 added parts (H,I,J) and day 2 removed parts (C). Using equation (1), the display parts are=A,B,C,D,E,F,G,H,I,J–(H,I,J)–(C)=A,B,D,E,F,G. In this example, removed parts are not present for day 1.

On day 4, the current parts list for this specific day is D,E,G,H,I,J,K,L. Day 4 changes from prior day are removed parts are A,B and added parts are K,L. The day 4 parts now in the model dataset are prior day model dataset plus added parts (K,L)=A,B,C,D,E,F,G,H,I,J,K,L for the model dataset.

To visualize day 4 parts, the process loads the model dataset and subtracts day 2 removed parts (C), day 3 removed parts (F), and day 4 removed parts (A,B)=D,E,G,H,I,J,K,L. This determination of display parts for the current day can be made using equation (1). To visualize changes from the prior day, color day 4 added parts in blue and color day 4 removed parts red.

To visualize day 2 now that the process is at day 4, process loads the model dataset and subtracts day 3 added parts (H,I,J), subtract day 4 added parts (K,L), and subtract day 2 removed parts (C)=A,B,C,D,E,F,G,H,I,J,K,L–(H,I,J)–(K, L)–(C)=A,B,D,E,F,G as the display parts. This determination of display parts can be made as follows:

$$view\_day\_n=full\_model\_dataset-\Sigma added\_parts\ (cur\ day\ to\ day\ n+1)-removed\_parts(day\ n) \qquad (2)$$

where view_day_n is the selected day for visualization, full_model_dataset is the model dataset, $\Sigma$ added parts (cur day->day n+1) are the parts added from the current day and day after the current day, and removed parts (day n are the parts removed on the current day.

The day 5 parts list for this specific day is A,D,E,G,H,I, J,K,M. Day 5 changes from prior day are removed parts L and added parts A,M. In this example, part A was removed in day 4 and is now added back in on day 5. The day 5 parts now in the updated model dataset are the prior day's model dataset plus added pats (A,M)=A,A,B,C,D,E,F,G,H,I,J,K, L,M as the update model day set for day 5. The model for part A was already in the model dataset and now in the model dataset two times.)

To visualize day 5 parts, equation (1) can be used to determine the display parts. The process model dataset and subtract day 2 removed parts (C), day 3 removed parts (F), day 4 removed parts (A,B), and day 5 removed parts (L)=A,D,E,G,H,I,J,K,M. The resulting display parts still include part A with one of the instances of part A being removed to determine the display parts.

Example 2

In this second example, change lists are generated from comparing the current parts list to the parts in the model dataset. In this example, points in time are days.

On day 1, the reference day parts list is A,B,C,D,E. No change are present on day 1. Day 1 parts now in the updated model dataset are from prior day's model dataset (none), plus (A,B,C,D,E)=A,B,C,D,E.

To view day 1 parts, the process loads the model dataset and subtract (none)=A,B,C,D,E as the display parts.

On day 2, the current parts list for this specific day is A,B,D,E,F,G. Day 2 changes from the model dataset the prior day are removed parts C and added parts F,G. The day 2 parts now in the updated model dataset taking into account prior day's model dataset plus added parts (F,G) is A,B,C, D,E,F,G.

To visualize day 2 parts, the process loads the model dataset and subtract day 2 removed parts (C) to obtain A,B,D,E,F,G as the display parts. The display parts can be determined as follows:

$$view\_current\_day=full\_dataset-removed\_parts(current\ day) \qquad (3)$$

where view_current_day is the display parts for the current day, full_dataset is the model dataset, and removed parts (current day) are parts removed in the current day. To visualize changes from the model dataset, the process can color day 2 added parts in blue and day 2 removed parts in red.

On day 3, the current parts list for this specific day is A,B,D,E,G,H,I,J. Day 3 changes compared to the model dataset are removed parts C,F and added parts H,I,J. The day 3 parts now in the updated model dataset are prior day's model dataset plus added parts (H,I,J)=A,B,C,D,E,F,G,H,I,J.

To view day 3 parts, the process loads the model dataset and subtracts day 3 removed parts (C,F)=A,B,D,E,G,H,I,J as the display parts. To visualize changes from full dataset, the process can color day 3 added parts blue (H,I,J) and day 3 removed parts (C,F) red.

To visualize changes from prior day, the process can color day 3 added parts blue (H,I,J) and day 3 removed parts (F) minus day 2 removed parts (C) in red, i.e. (C,F)–(C)=(F).

The following equation can be used to determine removed parts:

$$day\_n\_removed\_parts=removed\_parts(day\ n)-removed\_parts(day\ n-1) \qquad (4)$$

where day_n_removed_parts are removed parts for day n, removed parts(day n) are parts removed on day n, and removed parts(day n–1) are parts removed the day prior to day n.

To view the day 2 list now that the process is at day 3, the process loads the model dataset and subtracts day 3 added parts (H,I,J) and subtracts day 2 removed parts (C)=A,B,C, D,E,F,G,H,I,J–(H,I,J)–(C)=A,B,D,E,F,G as the display parts.

On day 4, the current parts list is D,E,G,H,I,J,K,L. Day 4 changes between the current part list and from model dataset are removed parts A,B,C,F and added parts K,L. Day 4 parts now in the updated model dataset based on the changes are model dataset plus added parts (K,L)=A,B,C,D,E,F,G,H,I,J, K,L.

To view day 4 parts, the process can use equation (1) to determine the display parts as the parts in the model dataset and subtract day 4 removed parts (A,B)=D,E,G,H,I,J,K,L as the display parts To recreate day 2 list now that the process is at day 4, the process takes the model dataset and subtracts day 4 added parts (K,L), subtracts day 3 added parts (H,I,J), and subtracts day 2 removed parts (C)=A,B,C,D,E,F,G,H,I,J,K,L–(K,L)–(H,I,J)–(C)=A,B,D,E,F,G as the recreated list. This determination of parts can be made using equation (2).

On day 5, the current parts list for this specific day is A,D,E,G,H,I,J,K,M. Day 5 changes from full dataset are removed parts B,C,F and added parts A,M. In this example, part A added is back to the model dataset. Day 5 parts in the updated model dataset are prior day's dataset plus added parts (A,M)=A,B,C,D,E,F,G,H,I,J,K,L,M as the updated model dataset. Part A was already in model dataset, but in this example the part is not added two time.

To view day 5 parts, the process can determine the display parts using equation (3) as follows: model dataset subtract day 5 removed items (B,C,F)=A,D,E,G,H,I,J,K,L,M.

Figure 10:
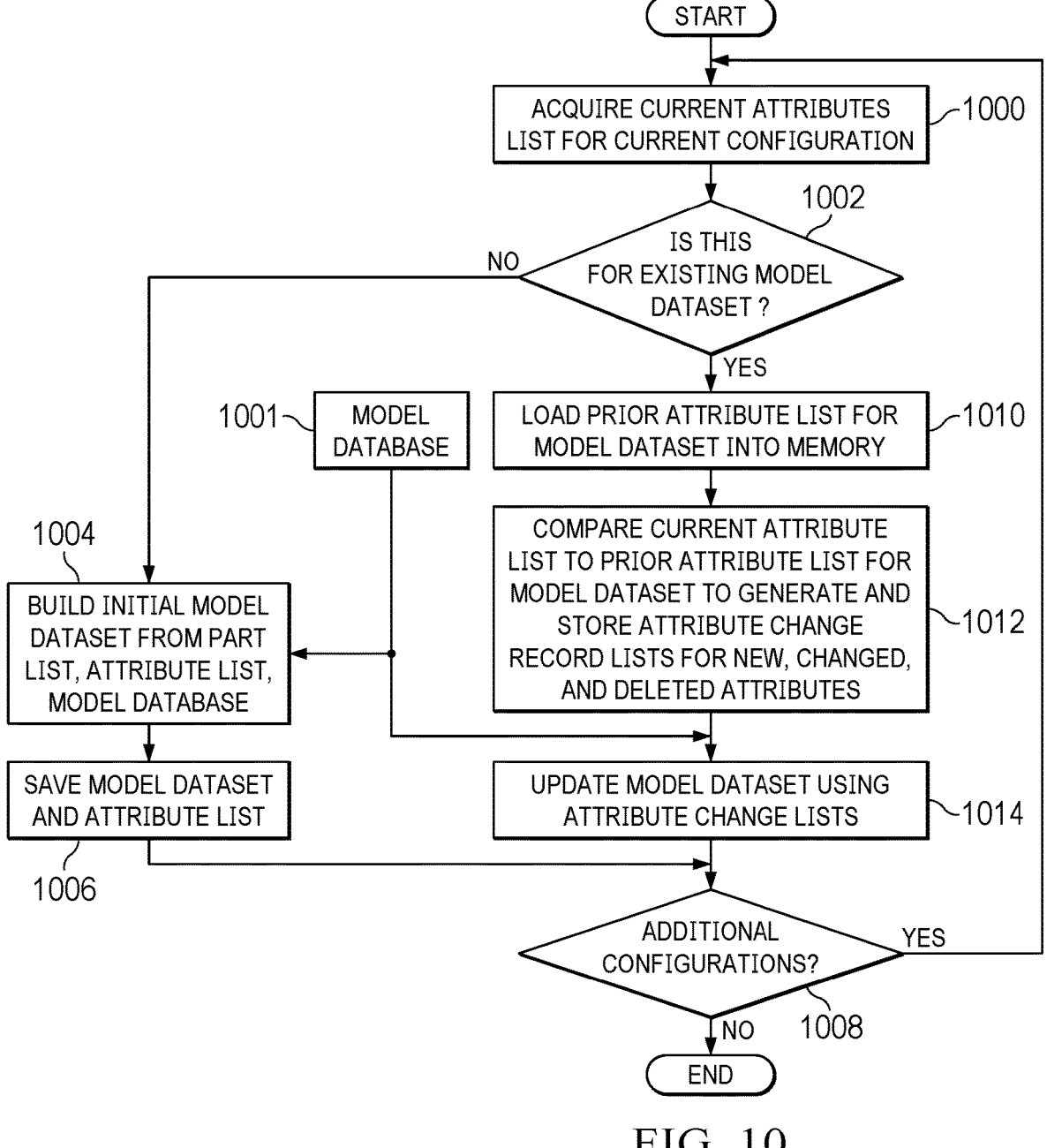
FIG. 10 is an illustration a flowchart of process for managing attributes for a model dataset for the vehicle having multiple configurations over time in which change lists are stored with attribute data in accordance with an illustrative example.

With reference next to FIG. 10, an illustration a flowchart of process for managing attributes for a model dataset for the vehicle having multiple configurations over time in which change lists are stored with attribute data is depicted in accordance with an illustrative example. The process in FIG. 10 can be implemented in hardware, software, or both. When implemented in software, the process can take the form of program code that is run by one of more processor units located in one or more hardware devices in one or more computer systems. For example, the process can be implemented in dataset manager 208 in computer system 206 in FIG. 2.

The process begins by acquiring a current attributes list for the current configuration of a vehicle (operation 1000). In this illustrative example, the attribute list contains attributes and values for the attributes. These attributes can be, for example, at least one of a build sequence, a parts identifier, a manufacturer, and identification of materials, processing steps to manufacture a part, and other suitable attributes containing information for a part.

The process determines whether the current attributes list is for existing model dataset (operation 1002). If the current attributes list is not for initial model dataset, the process builds initial model dataset from a current parts list, the current attributes list, and model database 1001 (operation 1004). In this illustrative example, the model database contains three-dimensional models of parts in the current parts list. The process saves the model dataset and the attributes list (operation 1006). The process determines additional configurations are present (operation 1008). Operation 1008 is used to determine whether additional vehicles with configurations are present for processing. This determination takes into account that multiple vehicles may be present. If additional configurations are not present, the process terminates. Otherwise, the process returns to operation 1000 as described above.

With reference again to operation 1002, if the current attributes list is for an existing model dataset, the process loads the prior attributes list for the model dataset into memory (operation 1010). In this illustrative example the prior attributes list in operation 1010 is an attributes list from a prior point in time in which a comparison was made between attributes for parts in the model dataset prior to changes at the point in time as reflected by the current attributes list.

The process compares the current attributes list to the prior attributes list to selectively generate and store in an attribute change list for new, changed, and deleted attributes (operation 1012). In operation 1012, the current attributes list is compared to prior attributes, which is the list of attributes present in the vehicle from the last update of parts to the vehicle. These lists are selectively generated because an attributes change list is generated in response to at least one of adding an attribute, changing attribute, or deleting attribute. If one of these changes is not occur, the change list not generated.

The process then updates the model dataset using the attribute change list (operation 1014) in this illustrative example, the update in operation 1014 involves at least one of associating new attributes to parts, removing attributes from parts, for changing attribute for parts.

The process proceeds to operation 1008 to determine whether additional configurations are present as previously described. In this manner, the process can continually generate addition and subtraction lists at different points in time.

Figure 11:
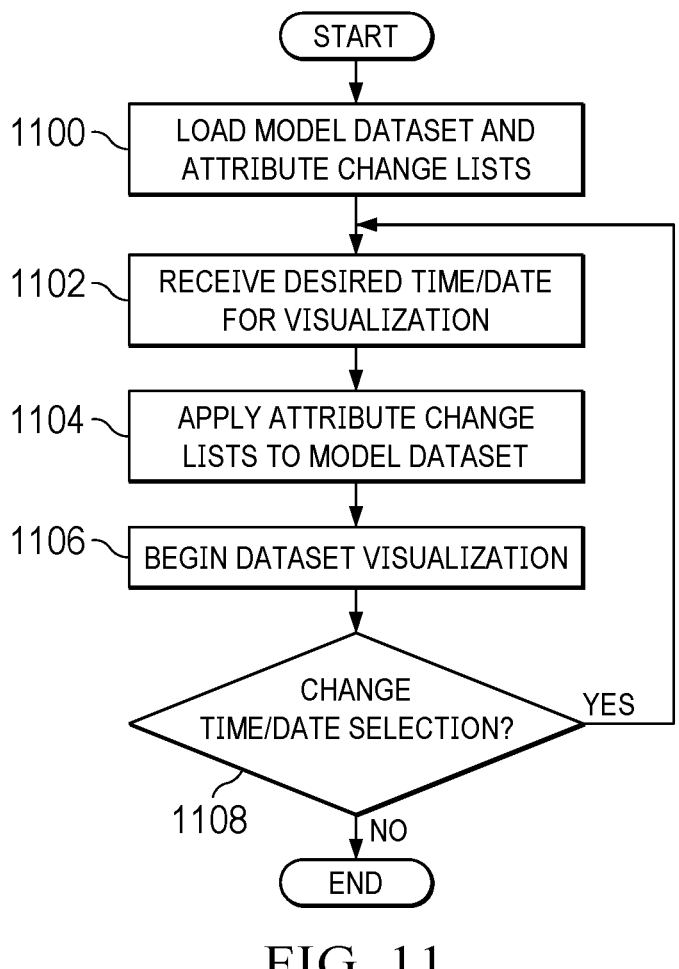
FIG. 11 is an illustration of a flowchart of a process for displaying a visualization of a vehicle using a model dataset having attributes is depicted in accordance with an illustrative example.

With reference next to FIG. 11, an illustration of a flowchart of a process for displaying a visualization of a vehicle using a model dataset having attributes is depicted in accordance with an illustrative example. The process in FIG. 11 can be implemented in hardware, software, or both. When implemented in software, the process can take the form of program code that is run by one of more processor units located in one or more hardware devices in one or more computer systems. For example, the process can be implemented in display manager 210 in computer system 206 in FIG. 2.

The process begins by loading the model dataset and attribute change lists (operation 1100). The process receives a desired time/date for the visualization (operation 1102). The process applies attribute change lists to the model dataset (operation 1104). In operation 1104, the application of the attribute change lists can put the changes into an attributes dataset located in the model dataset.

The process creates a visualization (operation 1106). At this point, the visualization contains the parts with the current attributes present in the vehicle at the desired time/date. In operation 1106, the creation of the visualization also includes sending the visualization to a display system for presentation.

The process then determines whether a time/date selection has changed (operation 1108). In this operation, another point in time can be selected for visualization. If a change in time/date selection has occurred, the process then returns to operation 1102. Otherwise, the process terminates.

Figure 12:
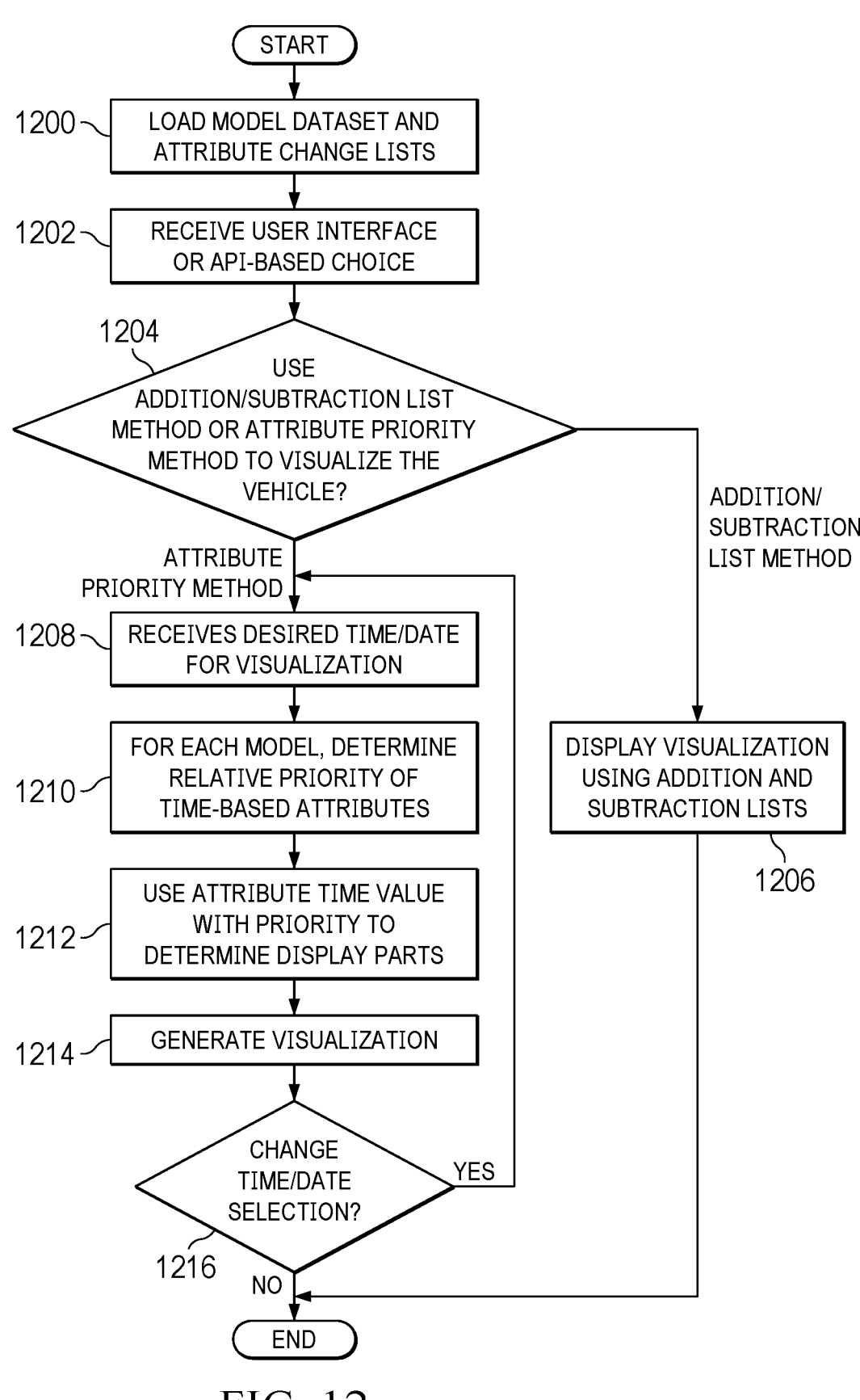
FIG. 12 is an illustration of a flowchart of a process for displaying visualization of a vehicle using a model dataset in which attribute priorities can be used in accordance with an illustrative example.

FIG. 12 is an illustration of a flowchart of a process for displaying visualization of a vehicle using a model dataset in which attribute priorities can be used in accordance with an illustrative example. The process in FIG. 12 can be implemented in hardware, software, or both. When implemented in software, the process can take the form of program code that is run by one of more processor units located in one or more hardware devices in one or more computer systems. For example, the process can be implemented in at least one of dataset manager 208 or display manager 210 in computer system 206 in FIG. 2.

The process begins by loading a model dataset and attribute change lists (operation 1200). The process receives a user interface for API based selection of a point in time (operation 1202). The choice received in operation 1202 selected type of visualization that is desired.

The process determines whether to use an addition/subtraction method or an attribute priority method to visualize the vehicle (operation 1204). If the addition/subtraction method is used, the process displays a visualization using addition and subtraction lists (operation 1206). This addition/subtraction method used in operation 1206 can be performed using the operations in FIG. 9 as described above. The process terminates thereafter.

With reference again to operation 1204, if an attribute priority method is used, the process receives the desired time/date are visualization (operation 1208). The process determines the relative priority of time-based attributes for each model in the model data set (operation 1210). In this operation, this priority can be determined using the attribute change lists. The process uses attribute time values with priority to determine display parts (operation 1212).

The process generates a visualization (operation 1214). In operation 1216, the visualization is generated using the display parts determined in operation 1212.

A determination is made as to whether they change in time/date selection has been made (operation 1216). If a change has been made, the process returns to operation 1208. Otherwise, the process terminates.

Figure 13:
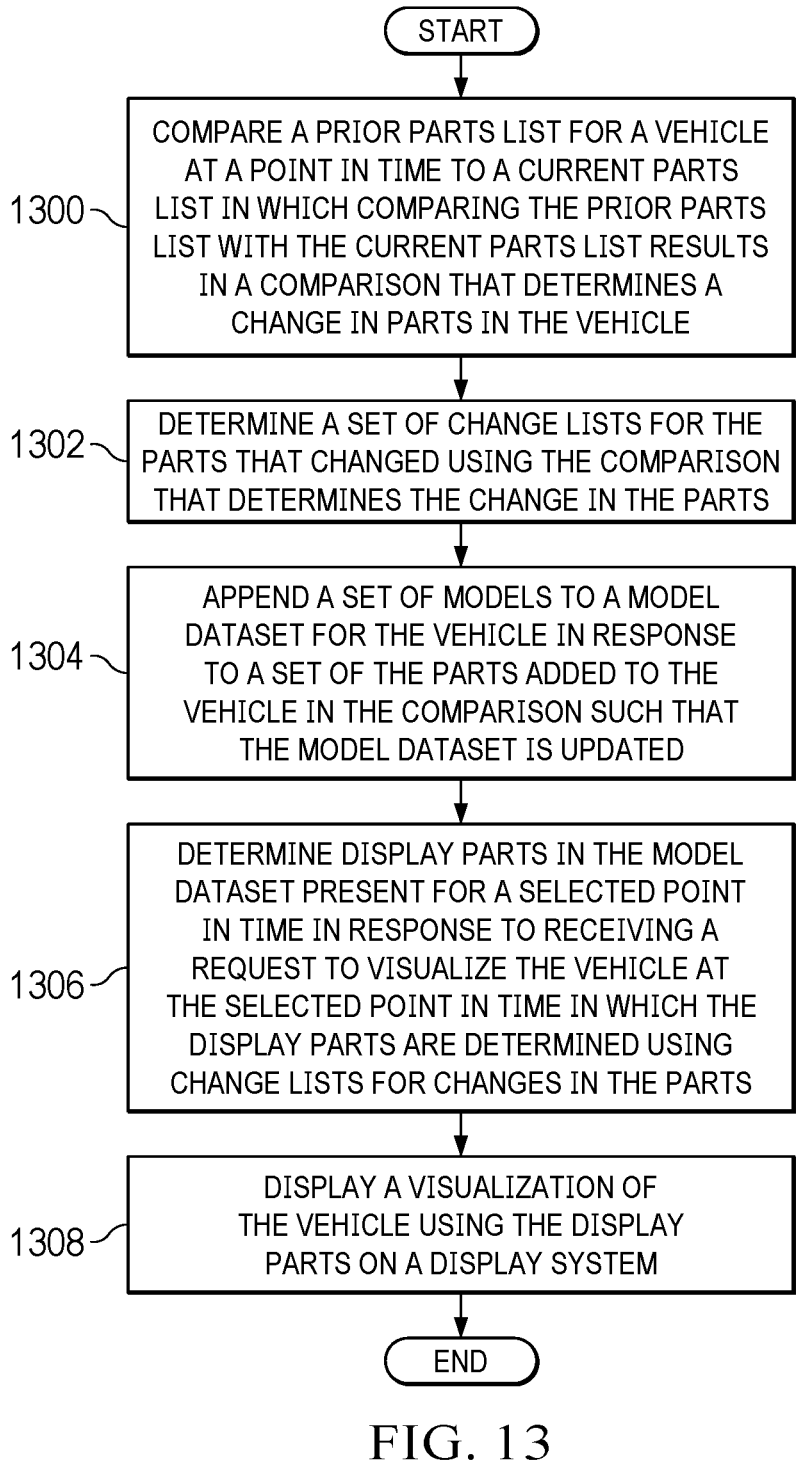
FIG. 13 is an illustration of a flowchart of a process for managing a temporal multi-configuration model dataset system depicted in accordance with an illustrative example.

Turning next to FIG. 13, an illustration of a flowchart of a process for managing a temporal multi-configuration model dataset system is depicted in accordance with an illustrative example. The process in FIG. 13 can be implemented in hardware, software, or both. When implemented in software, the process can take the form of program code that is run by one of more processor units located in one or more hardware devices in one or more computer systems. For example, the process can be implemented in at least one of dataset manager 208 or display manager 210 in computer system 206 in FIG. 2.

The process begins by comparing a prior parts list for a vehicle at a point in time to a current parts list in which comparing the prior parts list with the current parts list results in a comparison that detects a change in parts in the vehicle (operation 1300). The process determines a set of change lists for the parts that changed using the comparison that detects the change in the parts (operation 1302). In operation 1302, the set of change lists is relative to a reference parts list for a reference point in time.

The process appends a set of models to a model dataset for the vehicle in response to a set of the parts added to the vehicle in the comparison such that such that the model dataset is updated (operation 1304). In operation 1304, the set of models correspond to the set of the parts added to the vehicle and wherein models are not removed from the model dataset in response to parts being removed from the vehicle in the comparison.

The process determines display parts in the model dataset present for a selected point in time in response to receiving a request to visualize the vehicle at the selected point in time in which the display parts are determined using change lists for changes in the parts (operation 1306). The process displays a visualization of the vehicle using the display parts on a display system (operation 1308). The process terminates thereafter.

Figure 14:
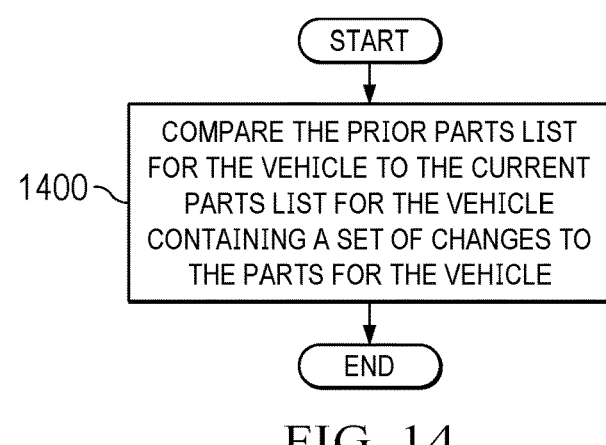
FIG. 14 is an illustration of a flowchart of a process comparing parts lists in accordance with an illustrative example.

With reference next to FIG. 14, an illustration of a flowchart of a process comparing parts lists is depicted in accordance with an illustrative example. The process in this flowchart is an example of an implementation for operation 1300 in FIG. 13.

The process compares the prior parts list for the vehicle to the current parts list for the vehicle containing a set of changes to the parts for the vehicle (operation 1400). The process terminates thereafter. In operation 1400, a result of comparing the prior parts list with the current parts list is a comparison detecting the set of changes between prior parts in the prior parts list and current parts in the current parts list for the vehicle.

Figure 15:
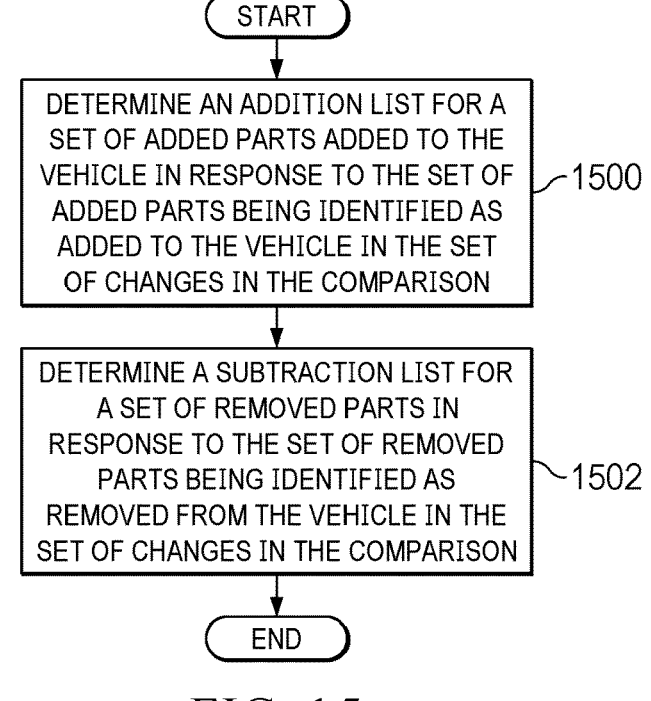
FIG. 15 is an illustration of a flowchart of a process determining change lists in accordance with an illustrative example.

Turning to FIG. 15, an illustration of a flowchart of a process determining change lists is depicted in accordance with an illustrative example. The process in this flowchart is an example of an implementation for operation 1302 in FIG. 13.

The process begins by determining an addition list for a set of added parts added to the vehicle in response to the set of added parts being identified as added to the vehicle in the set of changes in the comparison (operation 1500). The process determines a subtraction list for a set of removed parts in response to the set of removed parts being identified as removed from the vehicle in the set of changes in the comparison (operation 1502). The process terminates thereafter. In operation 1502, the addition list and the subtraction list are the set of change lists for the parts.

Figure 16:
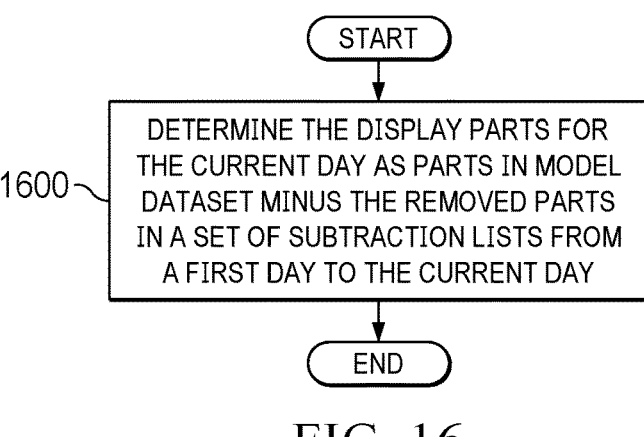
FIG. 16 is an illustration of a flowchart of a process determining display parts for a current point in time in accordance with an illustrative example.

In FIG. 16, an illustration of a flowchart of a process determining display parts for a current point in time is depicted in accordance with an illustrative example. The process in this figure is an example of an implementation for operation 1306 in FIG. 13. In this example, the selected point in time is a current day and the prior parts list is a parts list for a prior day.

The process determines the display parts for the current day as parts in model dataset minus the removed parts in a set of subtraction lists from a first day to the current day (operation 1600). The process terminates thereafter.

With reference to FIG. 17, an illustration of a flowchart of a process determining display parts for a point in time other than a current point in time is depicted in accordance with an illustrative example. The process in this figure is an example of an implementation for operation 1306 in FIG. 13. In this example, the selected point in time is a selected day, the prior parts list is a parts list for a prior day. The selected day can be a day other than the current day in this example.

The process determines the display parts for the selected point in time as the parts in model dataset minus the removed parts in a set of subtraction lists from a reference point in time to the selected day (operation 1700). The process terminates thereafter.

With next reference to FIG. 18, an illustration of a flowchart of a process determining display parts is depicted in accordance with an illustrative example. The process in this figure is an example of an implementation for operation 1306 in FIG. 13. In this example, the selected point in time is a current day and the prior parts list is all of the parts in the model dataset as of a last update.

The process determines the display parts for the current day as all of the parts in model dataset minus the removed parts for the current day (operation 1800 the process terminates thereafter).

Turning to FIG. 19, an illustration of a flowchart of a process determining display parts is depicted in accordance with an illustrative example. The process in this figure is an example of an implementation for operation 1306 in FIG. 13. In this example, the selected point in time is a selected day and the prior parts list is all of the parts in the model dataset as of a last update. In this example, the selected point in time is a selected day and the prior parts list is all of the parts in the model dataset as of a last update.

The process determines the display parts for the selected point in time as the parts in the model dataset minus the removed parts from a current day to a day after the selected day (operation 1900). The process terminates thereafter.

With reference to FIG. 20, an illustration of a flowchart of a process for displaying graphical indicators is depicted in accordance with an illustrative example. The process in this flowchart can be performed with the operations in the process in FIG. 13.

The process displays displaying a number of graphical indicators in the visualization in which the number of graphical indicates indicate at least one of the parts added or the parts removed are absent from the vehicle based on the set of change lists (operation 2000). The process terminates thereafter.

In FIG. 21, an illustration of a flowchart of a process for changing a reference point in time is depicted in accordance with an illustrative example. The process illustrated in this figure can be formed with other operations in the process in FIG. 13. In this example, the reference point in time is a current reference point in time.

The process creates a new reference parts list for a new reference point in time (operation 2100). The process terminates thereafter. The reference parts list for the new reference point is the one used to determine parts added in removed when displaying a visualization of the vehicle.

With now reference to FIG. 22, an illustration of a flowchart of a process for changing a reference point in time is depicted in accordance with an illustrative example. The process illustrated in this figure is an example of an implementation for operation 2100 in FIG. 21.

The process begins by identifying change lists between the current reference point in time and the new reference point in time (operation 2200). The process adds parts in addition lists in the change lists to the reference parts list in response to the new reference point in time being later than the current reference point in time (operation 2202). The process subtracts parts in subtraction lists in the change lists from the reference parts list in response to the new reference point in time being later than the reference point in time (operation 2204). The process terminates thereafter.

With reference to FIG. 23, an illustration of a flowchart of a process for changing a reference point in time is depicted in accordance with an illustrative example. The process illustrated in this figure is an example of an implementation for operation 2100 in FIG. 21. In this example, the reference point in time is a current reference point in time.

The process begins by identifying change lists between the current reference point in time and the new reference point in time (operation 2300). The process subtracts parts in addition lists in the change lists from the reference parts list in response to the new reference point in time earlier later than the current reference point in time (operation 2302). The process adds parts in subtraction lists in the change lists to the reference parts list in response to the new reference point in time being earlier than a current reference point in time (operation 2304). The process terminates thereafter.

With reference next to FIG. 24, an illustration of a flowchart of a process for managing attributes associated with parts in the model dataset for the vehicle is depicted in accordance with an illustrative example. The process illustrated in this figure can be formed with other operations in the process in FIG. 10.

The process begins by comparing a prior attributes list for the vehicle at a point in time to a current attributes list (operation 2400). In operation 2400, in the comparing of the prior attributes list with a current attributes list results in another comparison that detects a change in attributes for parts for the vehicle.

The process determines a set of attribute change lists for the attributes that changed using the comparison that detects the change in the attributes for the parts (operation 2402). The process terminates thereafter. In operation 2402, the set of change lists is relative to a reference attributes list for the reference point in time.

The flowcharts and block diagrams in the different depicted examples illustrate the architecture, functionality, and operation of some possible implementations of apparatuses and methods in an illustrative example. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware.

In some alternative implementations of an illustrative example, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 25:
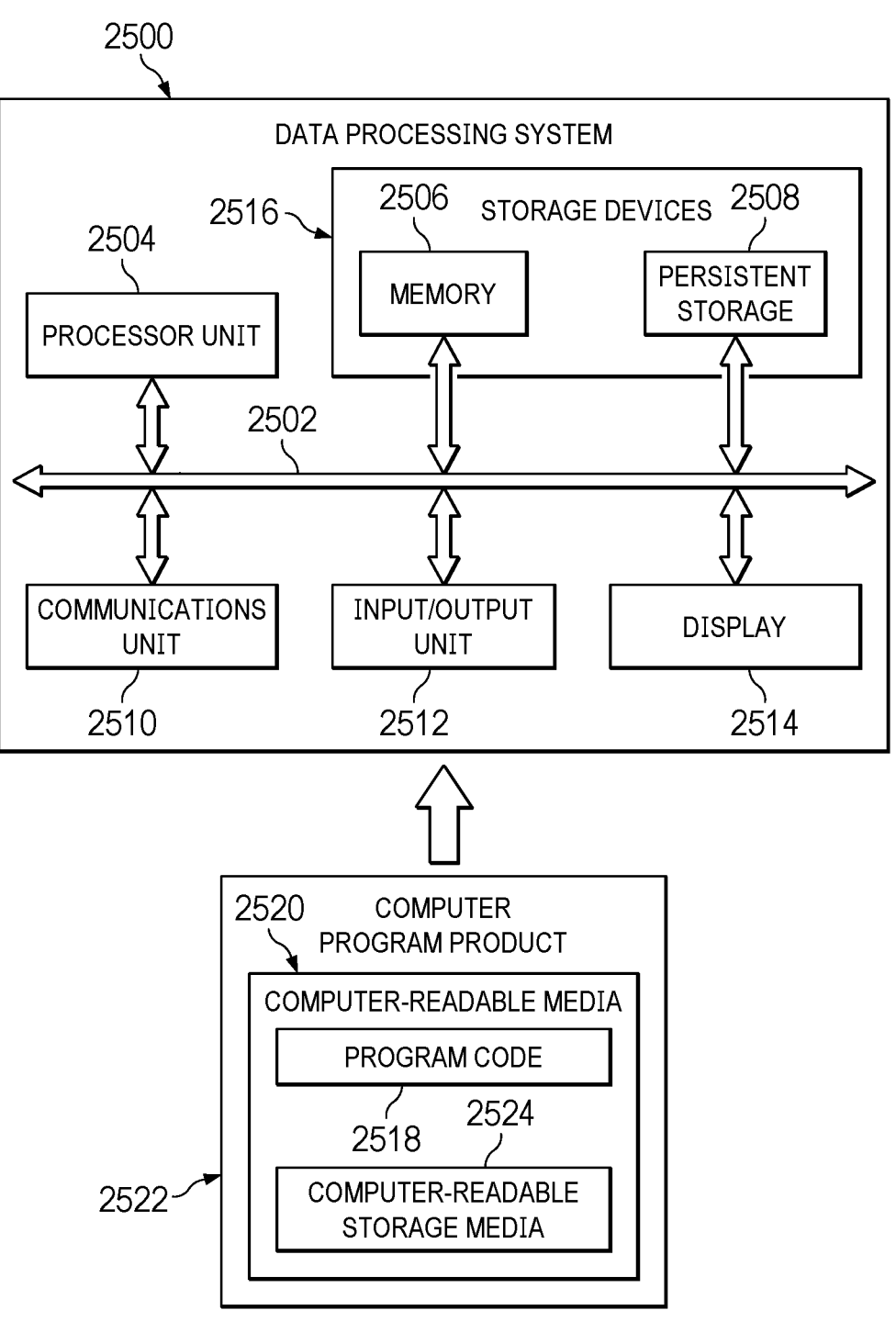
FIG. 25 is an illustration of a block diagram of a data processing system in accordance with an illustrative example.

Turning now to FIG. 25, an illustration of a block diagram of a data processing system is depicted in accordance with an illustrative example. Data processing system 2500 can be used to implement server computer 104, server computer 106, and client devices 110, in FIG. 1. Data processing system 2500 can also be used to implement computer system 206. In this illustrative example, data processing system 2500 includes communications framework 2502, which provides communications between processor unit 2504, memory 2506, persistent storage 2508, communications unit 2510, input/output (I/O) unit 2512, and display 2514. In this example, communications framework 2502 takes the form of a bus system.

Processor unit 2504 serves to execute instructions for software that can be loaded into memory 2506. Processor unit 2504 includes one or more processors. For example, processor unit 2504 can be selected from at least one of a multicore processor, a central processing unit (CPU), a graphics processing unit (GPU), a physics processing unit (PPU), a digital signal processor (DSP), a network processor, or some other suitable type of processor. Further, processor unit 2504 can may be implemented using one or more heterogeneous processor systems in which a main processor is present with secondary processors on a single chip. As another illustrative example, processor unit 2504 can be a symmetric multi-processor system containing multiple processors of the same type on a single chip.

Memory 2506 and persistent storage 2508 are examples of storage devices 2516. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 2516 may also be referred to as computer-readable storage devices in these illustrative examples. Memory 2506, in these examples, can be, for example, a random-access memory or any other suitable volatile or non-volatile storage device. Persistent storage 2508 can take various forms, depending on the particular implementation.

For example, persistent storage 2508 may contain one or more components or devices. For example, persistent storage 2508 can be a hard drive, a solid-state drive (SSD), a flash memory, a rewritable optical disk, a rewritable magnetic tape, or some combination of the above. The media used by persistent storage 2508 also can be removable. For example, a removable hard drive can be used for persistent storage 2508.

Communications unit 2510, in these illustrative examples, provides for communications with other data processing systems or devices. In these illustrative examples, communications unit 2510 is a network interface card.

Input/output unit 2512 allows for input and output of data with other devices that can be connected to data processing system 2500. For example, input/output unit 2512 can provide a connection for user input through at least one of a keyboard, a mouse, or some other suitable input device. Further, input/output unit 2512 can send output to a printer. Display 2514 provides a mechanism to display information to a user.

Instructions for at least one of the operating system, applications, or programs can be located in storage devices 2516, which are in communication with processor unit 2504 through communications framework 2502. The processes of the different examples can be performed by processor unit 2504 using computer-implemented instructions, which can be located in a memory, such as memory 2506.

These instructions are program instructions and are also referred to as program code, computer usable program code, or computer-readable program code that can be read and executed by a processor in processor unit 2504. The program code in the different examples can be embodied on different physical or computer-readable storage media, such as memory 2506 or persistent storage 2508.

Program code 2518 is located in a functional form on computer-readable media 2520 that is selectively removable and can be loaded onto or transferred to data processing system 2500 for execution by processor unit 2504. Program code 2518 and computer-readable media 2520 form computer program product 2522 in these illustrative examples. In the illustrative example, computer-readable media 2520 is computer-readable storage media 2524.

Computer-readable storage media 2524 is a physical or tangible storage device used to store program code 2518 rather than a media that propagates or transmits program code 2518. Computer-readable storage media 2524, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Alternatively, program code 2518 can be transferred to data processing system 2500 using a computer-readable signal media. The computer-readable signal media are signals and can be, for example, a propagated data signal containing program code 2518. For example, the computer-readable signal media can be at least one of an electromagnetic signal, an optical signal, or any other suitable type of signal. These signals can be transmitted over connections, such as wireless connections, optical fiber cable, coaxial cable, a wire, or any other suitable type of connection.

Further, as used herein, "computer-readable media 2520" can be singular or plural. For example, program code 2518 can be located in computer-readable media 2520 in the form of a single storage device or system. In another example, program code 2518 can be located in computer-readable media 2520 that is distributed in multiple data processing systems. In other words, some instructions in program code 2518 can be located in one data processing system while other instructions in program code 2518 can be located in one data processing system. For example, a portion of program code 2518 can be located in computer-readable media 2520 in a server computer while another portion of program code 2518 can be located in computer-readable media 2520 located in a set of client computers.

The different components illustrated for data processing system 2500 are not meant to provide architectural limitations to the manner in which different examples can be implemented. In some illustrative examples, one or more of the components may be incorporated in or otherwise form a portion of, another component. For example, memory 2506, or portions thereof, can be incorporated in processor unit 2504 in some illustrative examples. The different illustrative examples can be implemented in a data processing system including components in addition to or in place of those illustrated for data processing system 2500. Other components shown in FIG. 25 can be varied from the illustrative examples shown. The different examples can be implemented using any hardware device or system capable of running program code 2518.

Figures 26, 27:
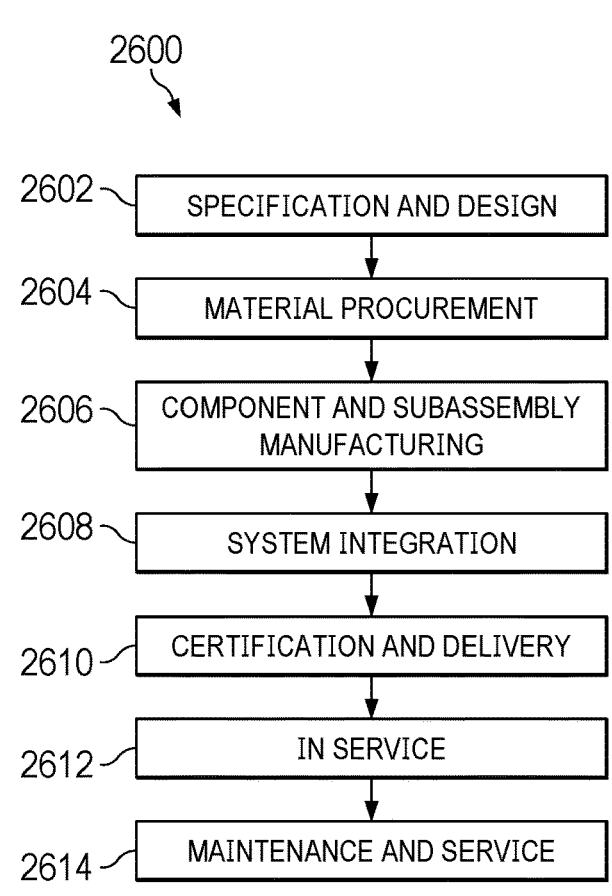
FIG. 26 is an illustration of an aircraft manufacturing and service method in accordance with an illustrative example.
FIG. 27 is an illustration of a block diagram of an aircraft in which an illustrative example may be implemented.

Illustrative examples of the disclosure may be described in the context of aircraft manufacturing and service method 2600 as shown in FIG. 26 and aircraft 2700 as shown in FIG. 27. Turning first to FIG. 26, an illustration of an aircraft manufacturing and service method is depicted in accordance with an illustrative example. During pre-production, aircraft manufacturing and service method 2600 may include specification and design 2602 of aircraft 2700 in FIG. 27 and material procurement 2604.

During production, component and subassembly manufacturing 2606 and system integration 2608 of aircraft 2700 in FIG. 27 takes place. Thereafter, aircraft 2700 in FIG. 27 can go through certification and delivery 2610 in order to be placed in service 2612. While in service 2612 by a customer, aircraft 2700 in FIG. 27 is scheduled for routine maintenance and service 2614, which may include modification, reconfiguration, refurbishment, and other maintenance or service.

Each of the processes of aircraft manufacturing and service method 2600 may be performed or carried out by a system integrator, a third party, an operator, or some combination thereof. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 27, an illustration of an aircraft is depicted in which an illustrative example may be implemented. In this example, aircraft 2700 is produced by aircraft manufacturing and service method 2600 in FIG. 26 and may include airframe 2702 with plurality of systems 2704 and interior 2706. Examples of systems 2704 include one or more of propulsion system 2708, electrical system 2710, hydraulic system 2712, and environmental system 2714. Any number of other systems may be included. Although an aerospace example is shown, different illustrative examples may be applied to other industries, such as the automotive industry.

Apparatuses and methods embodied herein may be employed during at least one of the stages of aircraft manufacturing and service method 2600 in FIG. 26.

In one illustrative example, components or subassemblies produced in component and subassembly manufacturing 2606 in FIG. 26 can be fabricated or manufactured in a manner similar to components or subassemblies produced while aircraft 2700 is in service 2612 in FIG. 26. As yet another example, one or more apparatus examples, method examples, or a combination thereof can be utilized during production stages, such as component and subassembly manufacturing 2606 and system integration 2608 in FIG. 26. One or more apparatus examples, method examples, or a combination thereof may be utilized while aircraft 2700 is in service 2612, during maintenance and service 2614 in FIG. 26, or both. The use of a number of the different illustrative examples may substantially expedite the assembly of aircraft 2700, reduce the cost of aircraft 2700, or both expedite the assembly of aircraft 2700 and reduce the cost of aircraft 2700.

For example, temporal multi-configuration model system 204 in FIG. 2 can be used to manage model datasets for different configurations of aircraft 2700 during specification and design 2602 of aircraft 2700, component and subassembly manufacturing 2606, and system integration 2608. As another example, temporal multi-configuration model system 204 also can be used to display different configurations of aircraft 2700 during routine maintenance and service 2614. For example, the display of the configurations may be used to plan or implement work orders for modification, reconfiguration, refurbishment, or other maintenance and service for aircraft 2700.

Further, reductions in cost of aircraft 2700 can be realized through reduced use of resources such as processor resources, bandwidth on networks, memory, or other storage space for model datasets having multiple configurations.

Figure 28:
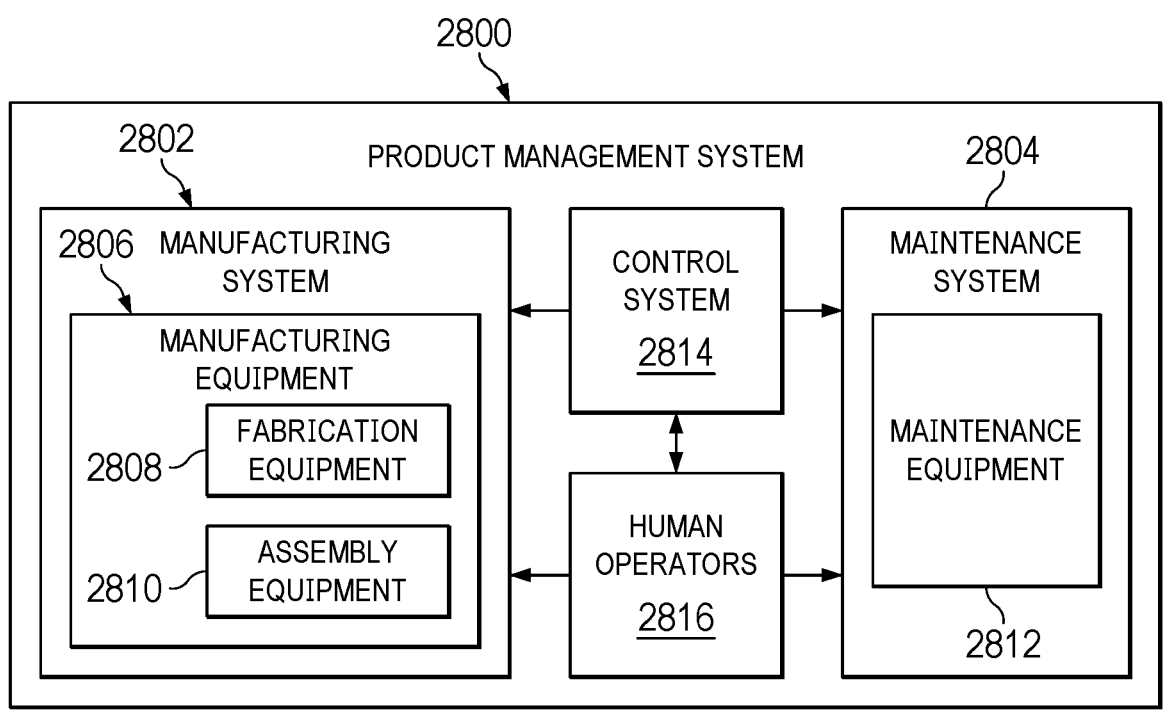
FIG. 28 is an illustration of a block diagram of a product management system in accordance with an illustrative example.

Turning now to FIG. 28, an illustration of a block diagram of a product management system is depicted in accordance with an illustrative example. Product management system 2800 is a physical hardware system. In this illustrative example, product management system 2800 includes at least one of manufacturing system 2802 or maintenance system 2804.

Manufacturing system 2802 is configured to manufacture products, such as aircraft 2700 in FIG. 27. As depicted, manufacturing system 2802 includes manufacturing equipment 2806. Manufacturing equipment 2806 includes at least one of fabrication equipment 2808 or assembly equipment 2810.

Fabrication equipment 2808 is equipment that used to fabricate components for parts used to form aircraft 2700 in FIG. 27. For example, fabrication equipment 2808 can include machines and tools. These machines and tools can be at least one of a drill, a hydraulic press, a furnace, an autoclave, a mold, a composite tape laying machine, an automated fiber placement (AFP) machine, a vacuum system, a robotic pick and place system, a flatbed cutting machine, a laser cutter, a computer numerical control (CNC) cutting machine, a lathe, or other suitable types of equipment. Fabrication equipment 2808 can be used to fabricate at least one of metal parts, composite parts, semiconductors, circuits, fasteners, ribs, skin panels, spars, antennas, or other suitable types of parts.

Assembly equipment 2810 is equipment used to assemble parts to form aircraft 2700 in FIG. 27. In particular, assembly equipment 2810 is used to assemble components and parts to form aircraft 2700 in FIG. 27. Assembly equipment 2810 also can include machines and tools. These machines and tools may be at least one of a robotic arm, a crawler, a faster installation system, a rail-based drilling system, or a robot. Assembly equipment 2810 can be used to assemble parts such as seats, horizontal stabilizers, wings, engines, engine housings, landing gear systems, and other parts for aircraft 2700 in FIG. 27.

In this illustrative example, maintenance system 2804 includes maintenance equipment 2812. Maintenance equipment 2812 can include any equipment needed to perform maintenance on aircraft 2700 in FIG. 27. Maintenance equipment 2812 may include tools for performing different operations on parts on aircraft 2700 in FIG. 27. These operations can include at least one of disassembling parts, refurbishing parts, inspecting parts, reworking parts, manufacturing replacement parts, or other operations for performing maintenance on aircraft 2700 in FIG. 27. These operations can be for routine maintenance, inspections, upgrades, refurbishment, or other types of maintenance operations.

In the illustrative example, maintenance equipment 2812 may include ultrasonic inspection devices, x-ray imaging systems, vision systems, drills, crawlers, and other suitable devices. In some cases, maintenance equipment 2812 can include fabrication equipment 2808, assembly equipment 2810, or both to produce and assemble parts that needed for maintenance.

Product management system 2800 also includes control system 2814. Control system 2814 is a hardware system and may also include software or other types of components. Control system 2814 is configured to control the operation of at least one of manufacturing system 2802 or maintenance system 2804. In particular, control system 2814 can control the operation of at least one of fabrication equipment 2808, assembly equipment 2810, or maintenance equipment 2812.

The hardware in control system 2814 can be implemented using hardware that may include computers, circuits, networks, and other types of equipment. The control may take the form of direct control of manufacturing equipment 2806. For example, robots, computer-controlled machines, and other equipment can be controlled by control system 2814. In other illustrative examples, control system 2814 can manage operations performed by human operators 2816 in manufacturing or performing maintenance on aircraft 2700. For example, control system 2814 can assign tasks, provide instructions, display models, or perform other operations to manage operations performed by human operators 2816.

In these illustrative examples, at least one of dataset manager 208 or display manager 210 from FIG. 2 can be implemented in control system 2814 to manage at least one of the manufacturing or maintenance of aircraft 2700 in FIG. 27. For example, dataset manager 208 can be used to manage model datasets used to manage model datasets during at least one of design, manufacturing, or maintenance of products such as aircraft 2700. Further, display manager 210 can be used to display visualizations of products such as aircraft 2700 at different points in time to human operators 2816. In the different illustrative examples, human operators 2816 can operate or interact with at least one of manufacturing equipment 2806, maintenance equipment 2812, or control system 2814. This interaction can occur to manufacture aircraft 2700 in FIG. 27.

Of course, product management system 2800 may be configured to manage other products other than aircraft 2700 in FIG. 27. Although product management system 2800 has been described with respect to manufacturing in the aerospace industry, product management system 2800 can be configured to manage products for other industries. For example, product management system 2800 can be configured to manufacture products for the automotive industry as well as any other suitable industries.

Some features of the illustrative examples are described in the following clauses. These clauses are examples of features not intended to limit other illustrative examples.

Clause 1

A temporal multi-configuration model dataset system comprising:

a computer system configured to:

compare a prior parts list for a vehicle at a point in time to a current parts list in which comparing of the prior parts list with the current parts list results in a comparison that detects a change in parts for the vehicle;

determine a set of change lists for the parts that changed using the comparison that detects the change in the parts, wherein the set of change lists is relative to a reference parts list for a reference point in time;

append a set of models to a model dataset for the vehicle in response to a set of the parts added to the vehicle in the comparison such that the model dataset is updated, wherein the set of models correspond to the set of the parts added to the vehicle and wherein models are not removed from the model dataset in response to the parts being removed from the vehicle in the comparison;

determine display parts in the model dataset present for a selected point in time in response to receiving a request to visualize the vehicle at the selected point in time in which the display parts are determined using the set of change lists; and display a visualization of the vehicle using the display parts determined to be present for the selected point in time on a display system.

Clause 2

The temporal multi-configuration model dataset system according to clause 1, wherein in comparing the prior parts list for the vehicle at the point in time to the current parts list, the computer system is configured to:

compare the prior parts list for the vehicle to the current parts list for the vehicle containing a set of changes to the parts for the vehicle, wherein a result of comparing the prior parts list with the current parts list is the comparison identifying the set of changes between prior parts in the prior parts list and current parts in the current parts list for the vehicle.

Clause 3

The temporal multi-configuration model dataset system according to clause 2, wherein in determining the set of change lists for the parts that changed using the comparison that detects the change in the parts for the vehicle, the computer system is configured to:

determine an addition list for a set of added parts added to the vehicle in response to the set of added parts being identified as added to the vehicle in the set of changes in the comparison; and determine a subtraction list for a set of removed parts in response to the set of removed parts being identified as removed from the vehicle in the set of changes in the comparison, wherein the addition list and the subtraction list are the set of change lists for the parts.

Clause 4

The temporal multi-configuration model dataset system according to clause 3, wherein the selected point in time is a current day, the prior parts list is a parts list for a prior day, and wherein in determining the display parts in the model dataset present for the current day, the computer system is configured to:

determine the display parts for the current day as parts in the model dataset minus the removed parts in a set of subtraction lists from a first day to the current day.

Clause 5

The temporal multi-configuration model dataset system according to clause 3, wherein the selected point in time is a selected day, the prior parts list is a parts list for a prior day, and wherein in determining the display parts in the model dataset present for the selected point in time, the computer system is configured to:

determine the display parts for the selected point in time as the parts in model dataset minus the removed parts in a set of subtraction lists from a reference point in time to the selected day.

Clause 6

The temporal multi-configuration model dataset system according to clause 3, wherein the selected point in time is a current day, the prior parts list is all of the parts in the model dataset as of a last update, and wherein in determining the display parts in the model dataset present for the current day, the computer system is configured to:

determine the display parts for the current day as all of the parts in the model dataset minus the removed parts for the current day.

Clause 7

The temporal multi-configuration model dataset system according to clause 3, wherein the selected point in time is a selected day, the prior parts list is all of the parts in the model dataset as of a last update, and wherein in determining the display parts in the model dataset present for the selected point in time, the computer system is configured to:

determine the display parts for the selected point in time as the parts in the model dataset minus the removed parts from a current day to a day after the selected day.

Clause 8

The temporal multi-configuration model dataset system according to one of clauses 1, 2, 3, 4, 5, 6, or 7 in which the computer system is configured to:

display a number of graphical indicators in the visualization in which the number of graphical indicators indicate at least one of the parts added or the parts removed are absent from the vehicle based on the set of change lists.

Clause 9

The temporal multi-configuration model dataset system according to one of clauses 1, 2, 3, 4, 5, 6, 7, or 8, wherein the computer system is configured to:

create a new reference parts list for a new reference point in time.

Clause 10

The temporal multi-configuration model dataset system according to clause 9, wherein the reference point in time is a current reference point in time and wherein in creating the new reference parts list for the new reference point in time, the computer system is configured to:

identify change lists between the current reference point in time and the new reference point in time;

add parts in addition lists in the change lists to the reference parts list in response to the new reference point in time being later than the current reference point in time; and subtract parts in subtraction lists in the change lists from the reference parts list in response to the new reference point in time being later than the current reference point in time.

Clause 11

The temporal multi-configuration model dataset system according to clause 9, wherein the reference point in time is a current reference point in time and wherein in creating the new reference parts list for the new reference point in time, the computer system is configured to:

identify change lists between the current reference point in time and the new reference point in time;

subtract parts in addition lists in the change lists from the reference parts list in response to the new reference point in time earlier than the current reference point in time; and add parts in subtraction lists in the change lists to the reference parts list in response to the new reference point in time being earlier than a current reference point in time.

Clause 12

The temporal multi-configuration model dataset system according to one of clauses 1, 2, 3, 4, 5, 6, 7, 8, 9, 10, or 11, wherein attributes are associated with the parts in the model dataset for the vehicle and wherein the computer system is configured to compare a prior attributes list for the vehicle at a point in time to a current attributes list in which comparing of the prior attributes list with a current attributes list results in another comparison that detects a change in attributes for parts for the vehicle; and determine a set of attribute change lists for the attributes that changed using the comparison that detects the change in the attributes for the parts, wherein the set of attribute change lists is relative to a reference attributes list for the reference point in time.

Clause 13

The temporal multi-configuration model dataset system according to one of clauses 1, 2, 3, 4, 5, 6, 7, 8, 9, 10, 11, or 12, wherein the vehicle is selected from a group comprising an aircraft, a tilt-rotor aircraft, a tilt wing aircraft, a vertical takeoff and landing aircraft, an electrical vertical takeoff and landing vehicle, a personal air vehicle, a surface ship, a tank, a personnel carrier, a train, a spacecraft, a space station, a submarine, a bus, and an automobile.

Clause 14

A temporal multi-configuration model dataset system comprising:

a computer system configured to:

receive a selected point in time for visualizing a vehicle;

determine display parts in a model dataset present for a selected point in time in response to receiving a request to visualize the vehicle at the selected point in time for a visualization of the vehicle in which the display parts are determined using a set of subtraction lists determined from a current point in time to the selected point in time, wherein the set of subtraction lists is for parts removed from the vehicle from the current point in time to the selected point in time; and display the model dataset on a display system at the selected point in time using the display parts for the parts present at the selected point in time, wherein the model dataset comprises models for the parts added to the vehicle over time without removing models from the model dataset in response to parts being removed from the vehicle.

Clause 15

A method for managing a multi-configuration model dataset, the method comprising:

comparing, by a computer system, a prior parts list for a vehicle at a point in time to a current parts list in which comparing the prior parts list with the current parts list results in a comparison that detects a change in parts in the vehicle;

determining, by the computer system, a set of change lists for the parts that changed using the comparison that detects the change in the parts, wherein the set of change lists is relative to a reference parts list for a reference point in time;

appending, by the computer system, a set of models to a model dataset for the vehicle in response to a set of the parts added to the vehicle in the comparison such that the model dataset is updated, wherein the set of models correspond to the set of the parts added to the vehicle and wherein models are not removed from the model dataset in response to the parts being removed from the vehicle in the comparison;

determining, by the computer system, display parts in the model dataset present for a selected point in time in response to receiving a request to visualize the vehicle at the selected point in time in which the display parts are determined using change lists for changes in the parts; and displaying, by the computer system, a visualization of the vehicle using the display parts on a display system.

Clause 16

The method according to clause 15, wherein comparing, by the computer system, the prior parts list for the vehicle at the point in time to the current parts list comprises:

comparing, by the computer system, the prior parts list for the vehicle to the current parts list for the vehicle containing a set of changes to the parts for the vehicle, wherein a result of comparing the prior parts list with the current parts list is a comparison detecting the set of changes between prior parts in the prior parts list and current parts in the current parts list for the vehicle.

Clause 17

The method according to clause 16, wherein determining, by the computer system, the set of change lists for the parts that changed using the comparison that detects the change in the parts for the vehicle comprises:

determining, by the computer system, an addition list for a set of added parts added to the vehicle in response to the set of added parts being identified as added to the vehicle in the set of changes in the comparison; and determining, by the computer system, a subtraction list for a set of removed parts in response to the set of removed parts being identified as removed from the vehicle in the set of changes in the comparison, wherein the addition list and the subtraction list are the set of change lists for the parts.

Clause 18

The method according to clause 17, wherein the selected point in time is a current day, the prior parts list is a parts list for a prior day, and in a wherein determining the display parts in the model dataset present for the current day comprising:

determining, by the computer system, the display parts for the current day as parts in the model dataset minus the removed parts in a set of subtraction lists from a first day to the current day.

Clause 19

The method according to clause 17, wherein the selected point in time is a selected day, the prior parts list is a parts list for a prior day, and wherein determining the display parts in the model dataset present for the selected point in time comprises:

determining, by the computer system, the display parts for the selected point in time as the parts in the model dataset minus the removed parts in a set of subtraction lists from a reference point in time to the selected day.

Clause 20

The method according to clause 17, wherein the selected point in time is a current day, the prior parts list is all of the parts in the model dataset as of a last update, and wherein determining the display parts in the model dataset present for the current day comprises:

determining, by the computer system, the display parts for the current day as all of the parts in the model dataset minus the removed parts for the current day.

Clause 21

The method according to clause 17, wherein the selected point in time is a selected day, the prior parts list is all of the parts in the model dataset as of a last update, and wherein determining the display parts in the model dataset present for the selected point in time comprises:

determining, by the computer system, the display parts for the selected point in time as the parts in the model dataset minus the removed parts from a current day to a day after the selected day.

Clause 22

The method according to one of clauses 15, 16, 17, 18, 19, or 20 further comprising:

displaying, by the computer system, a number of graphical indicators in the visualization in which the number of graphical indicates indicate at least one of the parts added or the parts removed are absent from the vehicle based on the set of change lists.

Clause 23

A method for visualizing a multi-configuration model dataset for a vehicle, the method comprising:

receiving a selected point in time for the visualizing the vehicle;

determining display parts in a model dataset that are present for a selected point in time in response to receiving a request to visualize the vehicle at the selected point in time for the visualization of the vehicle in which the display parts are determined using a set of subtraction lists determined from a current point in time to the selected point in time, wherein the set of subtraction lists is for parts removed from the vehicle from the current point in time to the selected point in time; and displaying the model dataset on a display system at the selected point in time using the display parts for the parts present at the selected point in time, wherein the model dataset comprises models for the parts added to the vehicle over time without removing models from the model dataset in response to the parts being removed from the vehicle.

Clause 24

The method according to clause 23 further comprising:

displaying a graphical user interface with a point in time control; and identifying the selected point in time based on a position of the point in time control.

Clause 25

The method according to clause 24, wherein the point in time control is selected from at least one of a slider, a dial, a scroll bar, a button, check boxes for points in time, a cycle button, a drop down list, a spinner, or a command line interface window.

Clause 26

The method according to clause 23, wherein the point in time is selected using an application programming interface.

Clause 27

A product management system comprising:

a control system, wherein the control system operates to:

compare a prior parts list for a vehicle at a point in time to a current parts list in which comparing of the prior parts list with the current parts list results in a comparison that detects a change in parts for the vehicle;

determine a set of change lists for the parts that changed using the comparison that detects the change in the parts, wherein the set of change lists is relative to a reference parts list for a reference point in time;

append a set of models to a model dataset for the vehicle in response to a set of the parts added to the vehicle in the comparison such that the model dataset is updated, wherein the set of models correspond to the set of the parts added to the vehicle and wherein models are not removed from the model dataset in response to the parts being removed from the vehicle in the comparison;

determine display parts in the model dataset present for a selected point in time in response to receiving a request to visualize the vehicle at the selected point in time in which the display parts are determined using the set of change lists; and display a visualization of the vehicle using the display parts determined to be present for the selected point in time on a display system.

Thus, one or more illustrative examples provide solutions to reducing the amount of resources needed to use model datasets storing multiple configurations for a vehicle. In the illustrative example, multiple configurations of vehicle can be displayed in a manner that reduces the amount of resources needed through the use of change lists to identify changes between the different configurations. The reduction in resource usage may reduce the cost and time for design and manufacturing of aircraft as well as the potential for reduced info structure costs associated with data storage.

The description of the different illustrative examples has been presented for purposes of illustration and description and is not intended to be exhaustive or limited to the examples in the form disclosed. The different illustrative examples describe components that perform actions or operations. In an illustrative example, a component can be configured to perform the action or operation described. For example, the component can have a configuration or design for a structure that provides the component an ability to perform the action or operation that is described in the illustrative examples as being performed by the component. Further, To the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative examples may provide different features as compared to other desirable examples. The example or examples selected are chosen and described in order to best explain the principles of the examples, the practical application, and to enable others of ordinary skill in the art to understand the disclosure for various examples with various modifications as are suited to the particular use contemplated.

What is claimed is:

1. A temporal multi-configuration model dataset system comprising:

a computer system configured to:

compare a prior parts list for a vehicle at a point in time to a current parts list in which comparing of the prior parts list with the current parts list results in a comparison that detects a change in parts for the vehicle;

determine a set of change lists for the parts that changed using the comparison that detects the change in the parts, wherein the set of change lists is relative to a reference parts list for a reference point in time;

append a set of three-dimensional models to a model dataset for the vehicle in response to a set of the parts added to the vehicle in the comparison such that the model dataset is updated, wherein the set of models correspond to the set of the parts added to the vehicle and wherein models are not removed from the model dataset in response to the parts being removed from the vehicle in the comparison;

determine display parts in the model dataset present for a selected point in time in response to receiving a request to visualize the vehicle at the selected point in time in which the display parts are determined using the set of change lists;

display a visualization of the vehicle using the display parts determined to be present for the selected point in time on a display system;

display a first number of graphical indicators in the visualization in which the first number of graphical indicators indicate at least one of the parts added for the selected point in time based on the set of change lists; and display a second number of graphical indicators in the visualization in which the second number of graphical indicators indicate at least the parts removed for the selected point in time that are absent from the vehicle based on the set of change lists.

2. The temporal multi-configuration model dataset system of claim 1, wherein in comparing the prior parts list for the vehicle at the point in time to the current parts list, the computer system is configured to:

compare the prior parts list for the vehicle to the current parts list for the vehicle containing a set of changes to the parts for the vehicle, wherein a result of comparing the prior parts list with the current parts list is the comparison detecting the set of changes between prior parts in the prior parts list and current parts in the current parts list for the vehicle.

3. The temporal multi-configuration model dataset system of claim 2, wherein in determining the set of change lists for the parts that changed using the comparison that detects the change in the parts for the vehicle, the computer system is configured to:

determine an addition list for a set of added parts added to the vehicle in response to the set of added parts being identified as added to the vehicle in the set of changes in the comparison; and determine a subtraction list for a set of removed parts in response to the set of removed parts being identified as removed from the vehicle in the set of changes in the comparison, wherein the addition list and the subtraction list are the set of change lists for the parts.

4. The temporal multi-configuration model dataset system of claim 3, wherein the selected point in time is a current day, the prior parts list is a parts list for a prior day, and wherein in determining the display parts in the model dataset present for the current day, the computer system is configured to:

determine the display parts for the current day as parts in the model dataset minus the removed parts in a set of subtraction lists from a first day to the current day.

5. The temporal multi-configuration model dataset system of claim 3, wherein the selected point in time is a selected day, the prior parts list is a parts list for a prior day, and wherein in determining the display parts in the model dataset present for the selected point in time, the computer system is configured to:

determine the display parts for the selected point in time as the parts in model dataset minus the removed parts in a set of subtraction lists from a reference point in time to the selected day.

6. The temporal multi-configuration model dataset system of claim 3, wherein the selected point in time is a current day, the prior parts list is all of the parts in the model dataset as of a last update, and wherein in determining the display parts in the model dataset present for the current day, the computer system is configured to:

determine the display parts for the current day as all of the parts in the model dataset minus the removed parts for the current day.

7. The temporal multi-configuration model dataset system of claim 3, wherein the selected point in time is a selected day, the prior parts list is all of the parts in the model dataset as of a last update, and wherein in determining the display parts in the model dataset present for the selected point in time, the computer system is configured to:

determine the display parts for the selected point in time as the parts in the model dataset minus the removed parts from a current day to a day after the selected day.

8. The temporal multi-configuration model dataset system of claim 1, wherein the first number of graphical indicators is a different color than the second number of graphical indicators.

9. The temporal multi-configuration model dataset system of claim 1, wherein the computer system is configured to:

create a new reference parts list for a new reference point in time.

10. The temporal multi-configuration model dataset system of claim 9, wherein the reference point in time is a current reference point in time and wherein in creating the new reference parts list for the new reference point in time, the computer system is configured to:

identify change lists between the current reference point in time and the new reference point in time;

add parts in addition lists in the change lists to the reference parts list in response to the new reference point in time being later than the current reference point in time; and subtract parts in subtraction lists in the change lists from the reference parts list in response to the new reference point in time being later than the current reference point in time.

11. The temporal multi-configuration model dataset system of claim 9, wherein the reference point in time is a current reference point in time and wherein in creating the new reference parts list for the new reference point in time, the computer system is configured to:

identify change lists between the current reference point in time and the new reference point in time;

subtract parts in addition lists in the change lists from the reference parts list in response to the new reference point in time being earlier than the current reference point in time; and add parts in subtraction lists in the change lists to the reference parts list in response to the new reference point in time being earlier than a current reference point in time.

12. The temporal multi-configuration model dataset system of claim 1, wherein attributes are associated with the parts in the model dataset for the vehicle and wherein the computer system is configured to:

compare a prior attributes list for the vehicle at a point in time to a current attributes list in which comparing of the prior attributes list with a current attributes list results in another comparison that detects a change in attributes for parts for the vehicle; and determine a set of attribute change lists for the attributes that changed using the comparison that detects the change in the attributes for the parts, wherein the set of attribute change lists is relative to a reference attributes list for the reference point in time.

13. A temporal multi-configuration model dataset system comprising: a computer system configured to:

receive a selected point in time for visualizing a vehicle;

determine display parts in a model dataset present for the selected point in time in response to receiving a request to visualize the vehicle at the selected point in time for a visualization of the vehicle in which the display parts are determined using a set of subtraction lists determined from a current point in time to the selected point in time, wherein the set of subtraction lists is for parts removed from the vehicle from the current point in time to the selected point in time;

display the model dataset on a display system at the selected point in time using the display parts for the parts present at the selected point in time, wherein the model dataset comprises models for the parts added to the vehicle over time without removing the models from the model dataset in response to parts being removed from the vehicle;

display a first number of graphical indicators on the display system in which the first number of graphical indicators indicate at least one of the parts added from the current point in time to the selected point in time; and display a second number of graphical indicators in the visualization in which the second number of graphical indicators indicate at least the parts removed from the current point in time to the selected point in time.

14. A method for managing a multi-configuration model dataset, the method comprising:

comparing, by a computer system, a prior parts list for a vehicle at a point in time to a current parts list in which comparing the prior parts list with the current parts list results in a comparison that detects a change in parts in the vehicle;

determining, by the computer system, a set of change lists for the parts that changed using the comparison that detects the change in the parts, wherein the set of change lists is relative to a reference parts list for a reference point in time;

appending, by the computer system, a set of models to a model dataset for the vehicle in response to a set of the parts added to the vehicle in the comparison such that the model dataset is updated, wherein the set of models correspond to the set of the parts added to the vehicle and wherein models are not removed from the model dataset in response to the parts being removed from the vehicle in the comparison;

determining, by the computer system, display parts in the model dataset present for a selected point in time in response to receiving a request to visualize the vehicle at the selected point in time in which the display parts are determined using change lists for changes in the parts;

displaying, by the computer system, a visualization of the vehicle using the display parts on a display system;

displaying a first number of graphical indicators in the visualization in which the first number of graphical indicators indicate at least one of the parts added for the selected point in time based on the set of change lists; and displaying a second number of graphical indicators in the visualization in which the second number of graphical indicators indicate at least the parts removed for the selected point in time that are absent from the vehicle based on the set of change lists.

15. The method of claim 14, wherein comparing, by the computer system, the prior parts list for the vehicle at the point in time to the current parts list comprises:

comparing, by the computer system, the prior parts list for the vehicle to the current parts list for the vehicle containing a set of changes to the parts for the vehicle, wherein a result of comparing the prior parts list with the current parts list is a comparison detecting the set of changes between prior parts in the prior parts list and current parts in the current parts list for the vehicle.

16. The method of claim 15, wherein determining, by the computer system, the set of change lists for the parts that changed using the comparison that detects the change in the parts for the vehicle comprises:

determining, by the computer system, an addition list for a set of added parts added to the vehicle in response to the set of added parts being identified as added to the vehicle in the set of changes in the comparison; and determining, by the computer system, a subtraction list for a set of removed parts in response to the set of removed parts being identified as removed from the vehicle in the set of changes in the comparison, wherein the addition list and the subtraction list are the set of change lists for the parts.

17. The method of claim 16, wherein the selected point in time is a current day, the prior parts list is a parts list for a prior day, and wherein determining the display parts in the model dataset present for the current day comprises:

determining, by the computer system, the display parts for the current day as parts in the model dataset minus the removed parts in a set of subtraction lists from a first day to the current day.

18. The method of claim 16, wherein the selected point in time is a selected day, the prior parts list is a parts list for a prior day, and wherein determining the display parts in the model dataset present for the selected point in time comprises:

determining, by the computer system, the display parts for the selected point in time as the parts in the model dataset minus the removed parts in a set of subtraction lists from a reference point in time to the selected day.

19. The method of claim 16, wherein the selected point in time is a current day, the prior parts list is all of the parts in the model dataset as of a last update, and wherein determining the display parts in the model dataset present for the current day comprises:

determining, by the computer system, the display parts for the current day as all of the parts in the model dataset minus the removed parts for the current day.

20. The method of claim 16, wherein the selected point in time is a selected day, the prior parts list is all of the parts in the model dataset as of a last update, and wherein determining the display parts in the model dataset present for the selected point in time comprises:

determining, by the computer system, the display parts for the selected point in time as the parts in the model dataset minus the removed parts from a current day to a day after the selected day.

* * * * *